(12) United States Patent
Oshino et al.

(10) Patent No.: US 6,859,337 B2
(45) Date of Patent: Feb. 22, 2005

(54) OPTICAL-ELEMENT MOUNTINGS EXHIBITING REDUCED DEFORMATION OF OPTICAL ELEMENTS HELD THEREBY

(75) Inventors: Tetsuya Oshino, Sagamihara (JP); Takeshi Okuyama, Yokohama (JP)

(73) Assignee: Nikon Corporation, Tokyo (JP)

(*) Notice: Subject to any disclaimer, the term of this patent is extended or adjusted under 35 U.S.C. 154(b) by 0 days.

(21) Appl. No.: 10/603,732

(22) Filed: Jun. 24, 2003

(65) Prior Publication Data

US 2003/0234989 A1 Dec. 25, 2003

(30) Foreign Application Priority Data

Jun. 24, 2002 (JP) ........................................ 2002-182867

(51) Int. Cl.$^7$ ................................................ G02B 7/02
(52) U.S. Cl. ........................ 359/819; 359/822; 359/813
(58) Field of Search ................................ 359/819, 814, 359/822, 823, 824

(56) References Cited

U.S. PATENT DOCUMENTS

| | | | |
|---|---|---|---|
| 4,681,408 A | | 7/1987 | Ahmad et al. |
| 4,726,671 A | | 2/1988 | Ahmad et al. |
| 5,249,082 A | | 9/1993 | Newman |
| 5,986,827 A | | 11/1999 | Hale |
| 6,392,825 B1 | * | 5/2002 | Trunz et al. ................ 359/819 |
| 6,400,516 B1 | * | 6/2002 | Spinali ........................ 359/819 |
| 2003/0162484 A1 | * | 8/2003 | Oshino ........................ 451/42 |

FOREIGN PATENT DOCUMENTS

| | | |
|---|---|---|
| EP | 1 312 965 A1 | 5/2003 |
| JP | 08-68899 | 3/1996 |

OTHER PUBLICATIONS

"Construction of the Projection Optics Box for the Engineering Test Stand", presentation to International SEMATECH, by John S. Taylor, Oct. 2000, 24 pages.

"Fabrication of ETS Set II Optics: Results and Future Development", presentation to $2^{nd}$ International Workshop on EUV Lithography, by Lou Marchetti et al., Oct. 2000, 20 pages.

"High–NA Camera for an EUVL Microstepper", presentation by Layton Hale et al., Oct. 2000, 13 pages.

* cited by examiner

*Primary Examiner*—Ricky Mack
(74) *Attorney, Agent, or Firm*—Klarquist Sparkman, LLP

(57) ABSTRACT

Optical-element mountings are disclosed for holding an optical element relative to an optical column of an optical system. The optical element can have mounting protrusions extending therefrom or lack such features. An exemplary embodiment of a mounting has a respective holding device mounted to each mounting protrusion. Each holding device has a first spring-loaded support member providing rigid support of the element in a gravity direction and flexible support in tangential, radial, and tilt directions. Each holding device also can include a second spring-loaded support member providing rigid support of the element in tangential directions and flexible support in the gravity and radial directions. Another embodiment includes multiple holding devices at respective locations relative to a mounting surface of the element. Each holding device includes a respective linking unit extending from the optical column to a respective bonding member attached to a bonding location on the mounting surface. Each bonding member has a bonding pad bonded to the respective bonding location and at least first and second spring members extending from the bonding pad in respective directions to the linking unit.

13 Claims, 12 Drawing Sheets

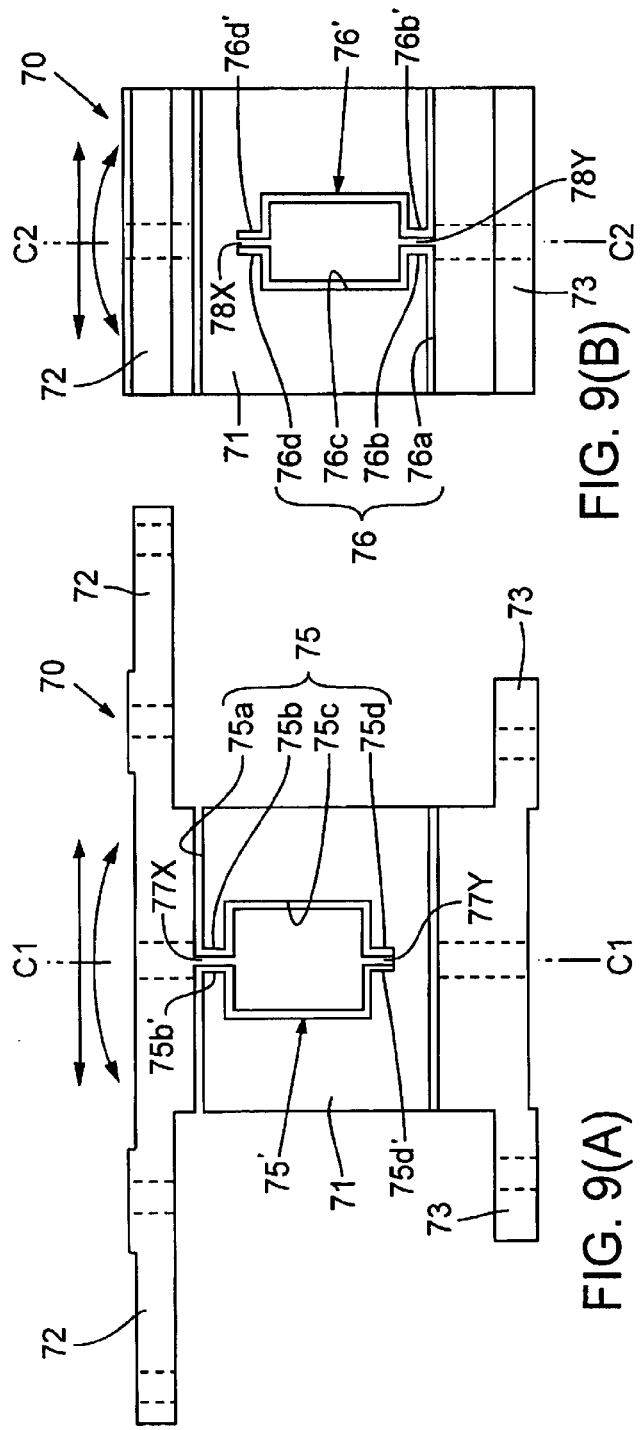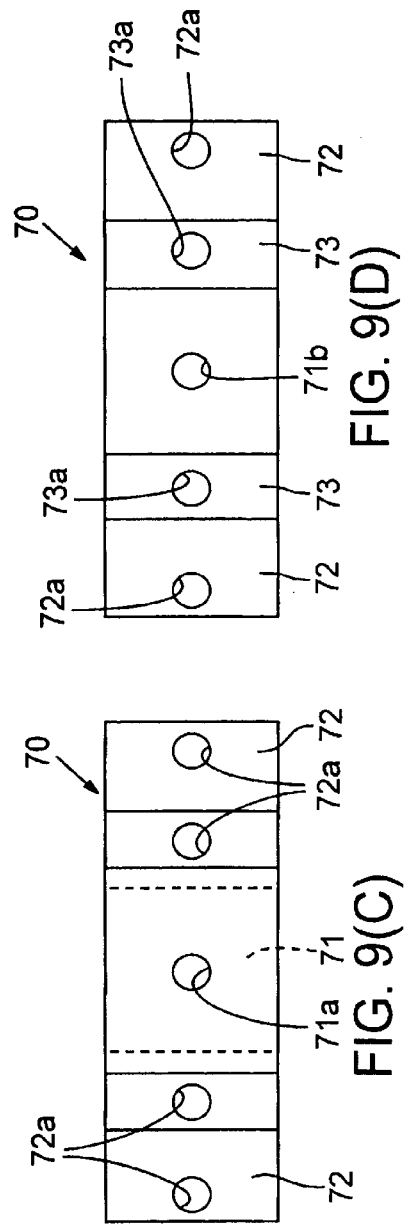
FIG. 9(A)
FIG. 9(B)
FIG. 9(C)
FIG. 9(D)

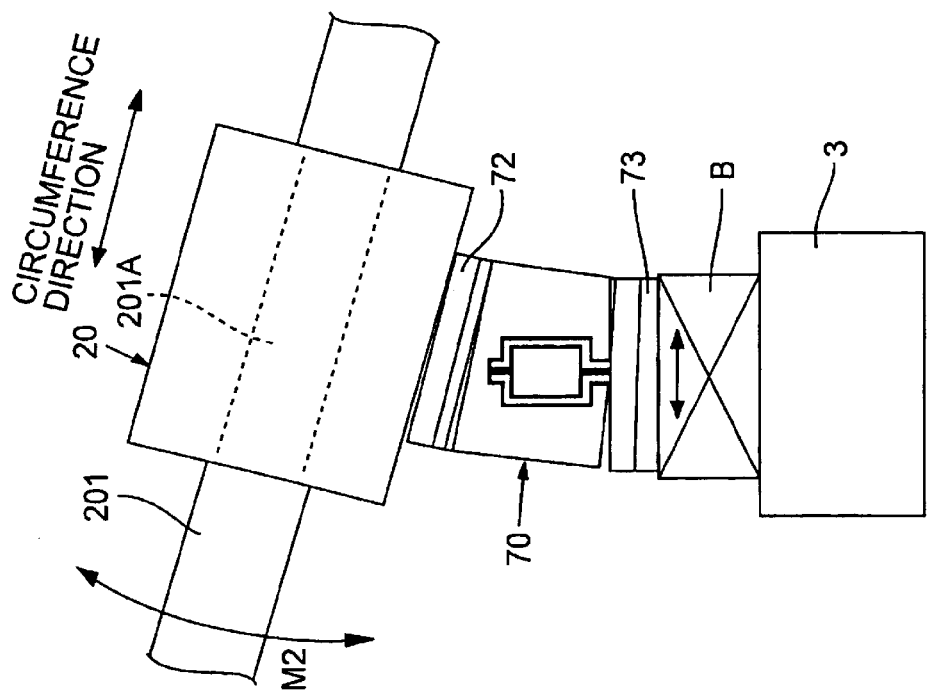
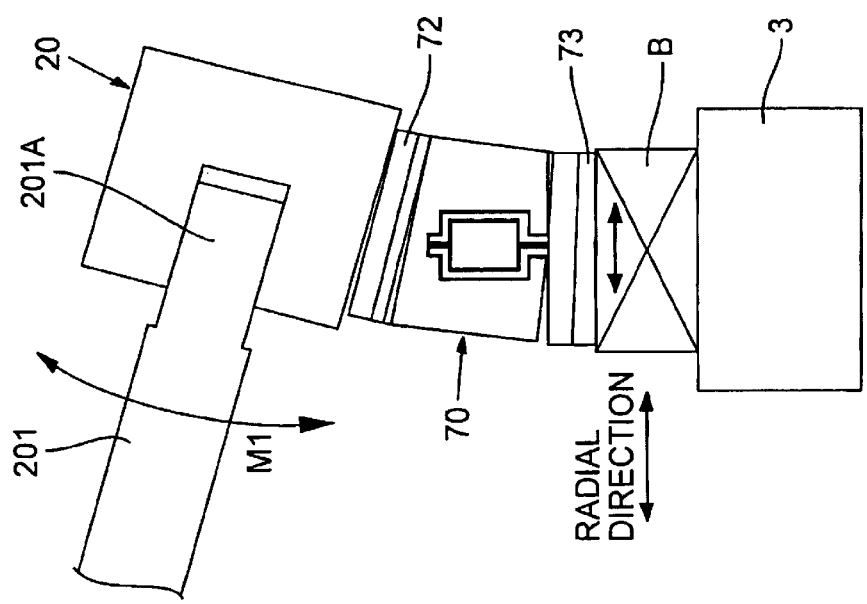
FIG. 11(A)
FIG. 11(B)

OPTICAL-ELEMENT MOUNTINGS EXHIBITING REDUCED DEFORMATION OF OPTICAL ELEMENTS HELD THEREBY

FIELD

This disclosure pertains to optical-element mountings (devices for holding optical elements, such as lenses and mirrors, in an "optical column" of an optical system). The disclosure more particularly pertains to optical-element mountings that restrict deformation of the respective optical elements held by them in high-precision optical equipment such as lithographic exposure systems used in microlithography of circuit patterns onto the surfaces of semiconductor wafers.

BACKGROUND

Conventional microlithographic exposure systems are summarized below in the context of such systems as used for performing exposures using extreme ultraviolet ("EUV") light, for example. Certain aspects of a conventional system of this type are shown schematically in FIG. 13, in which the depicted system includes an EUV source 101, an illumination-optical system 103 that irradiates a beam 100 of EUV light ($\lambda$=13.4 nm) from the EUV source 101 to a reflective pattern-defining reticle 102. "Patterned" EUV light (carrying an aerial image of the pattern portion illuminated by the beam 100) passes through a projection-optical system 105 that projects the aerial image onto the resist-coated surface of a wafer 104 or other suitable lithographic substrate. During this exposure the reticle 102 is held on a reticle stage 106, and the substrate 104 is held on a "wafer stage" 107, and exposure of the substrate 104 results in "transfer" of the pattern, defined on the reticle 102, onto the substrate 104.

The projection-optical system 105 typically comprises multiple (e.g., two, four, or six) multilayer-coated reflective mirrors (not detailed). As the projection-optical system 105 projects the aerial image onto the substrate surface, the image is demagnified or "reduced," usually by a factor of 5 (i.e., the projection-optical system exhibits a "demagnification ratio" of 1/5). The projection-optical system 105 typically has an annular-shaped optical field for exposure, for example 2-mm wide and 30-mm long as projected onto the wafer 104. Each of the reflective multilayer-coated mirrors of the projection-optical system 105 typically has an aspherical reflective surface. So as to be highly reflective to incident EUV radiation of $\lambda$=13.4 nm, the reflective surface of each mirror has a multilayer-film coating such as alternating layers of Mo and Si. During an actual exposure, the reticle 102 and wafer 104 are scanningly moved by their respective stages 106, 107 at synchronous velocities (according to the demagnification ratio). For example, under these conditions the wafer 104 is scanned at a velocity that is 1/5 the scanning velocity of the reticle 102. By performing exposure in a scanning manner in this way, it is possible to transfer a large pattern that extends over an area that is larger than the width of the optical field of the projection-optical system 105.

FIG. 14 shows in greater detail an exemplary conventional EUV optical column 110 such as a type that would be used in an EUV microlithography system. The particular optical column 110 of FIG. 14 comprises two reflective mirrors (more generally termed "optical elements") 111, 112 and their respective mountings 116, 117. The optical column 110 also comprises a column main unit 110a and a flange unit 110b that desirably are made of a low-thermal-expansion material such as invar so as not to be exhibit excessive thermal deformation. The mounting 116 for the mirror 111 includes a position-adjustment mechanism 115 (e.g., a piezoelectric motor) mounted on the upstream-facing surface of the flange unit 110b. The position-adjustment mechanism 115 allows the position of the mirror 111 to be adjusted relative to the flange unit 110b during and after assembly of the optical column 110. The mounting 117 for the mirror 112 is mounted to the downstream-facing surface (lower surface in the figure) of the flange unit 110b. Respective voids 111a, 112a are defined in each of the mirrors 111, 112. An EUV beam 100 reflected from the surface of a reticle (not shown, but situated upstream of the depicted optical column 110) propagates to the upper surface of the mirror 112 through the void 111a in the mirror 111. Light of the EUV beam 100 reflected from the upper surface of the mirror 112 propagates to the lower surface of the mirror 111, from which the EUV beam 100 is reflected downward through the void 112a in the mirror 112 to the substrate (not shown but situated on an image plane, just downstream of the depicted optical column 110, at which the beam 100 converges).

So as to be reflective to incident EUV radiation, the respective surface (which is aspherical) of each mirror 111, 112 of the optical column 110 of FIG. 14 has a surficial Mo/Si multilayer coating. The depicted optical system has a numerical aperture (NA) of 0.3 and exhibits a wavefront aberration of no greater than 1 nm (RMS). To achieve such demanding performance, the respective aspherical surface of each mirror 111, 112 is formed with extremely high accuracy before the multilayer coating is applied. In addition, the multilayer coatings are applied with extremely high accuracy, and each mirror 111, 112 is mounted in the optical column 110 with extremely high accuracy, preferably in a manner allowing independent adjustment of the mirrors while in the optical column.

This adjustable placement of each mirror 111, 112 in the optical column 110 is achieved by the respective mountings 116, 117. It is important that the mountings 116, 117 be capable of holding the respective mirrors 111, 112 without causing any deformation of the mirrors 111, 112. It also is important that the mountings 116, 117 be capable of preventing positional shifts of the respective mirrors 111, 112 while the mirrors are mounted in the optical column 110. Unfortunately, conventional mountings for optical elements do not exhibit satisfactory performance in these regards, especially in optical columns intended for extremely demanding use, such as in EUV optical columns for use in EUV microlithography systems.

SUMMARY

The needs summarized above are addressed by various aspects of the invention, wherein, inter alia, optical-element mountings are provided that prevent deformational and positional changes of respective optical elements held by such devices. In certain embodiments, the mountings are capable of actively deforming the respective optical elements held by the devices so as to allow the optical elements to exhibit optimal performance.

To such end, and according to a first aspect of the invention, optical-element mountings are provided for holding an optical element relative to an optical column of an optical system that includes the optical element. An embodiment of such a mounting comprises multiple holding devices arranged at respective locations relative to a mounting surface (e.g., a peripheral side surface) of the optical element. Each holding device comprises a respective linking unit extending from a respective location on the optical column to a respective bonding member attached to a respective bonding location on the mounting surface. Each bonding member comprises a bonding pad bonded to the respective bonding location on the mounting surface. At least first and second spring members extend from the bonding pad in respective directions to the linking unit. Desirably, at least three holding devices arranged at respective equiangular locations relative to the mounting surface.

In each holding device the respective first and second spring members desirably extend in opposite directions from the bonding pad, further desirably along a line parallel to a tangent line at the bonding location. Each spring member desirably comprises a respective rigid portion flanked by respective flat springs. The flat springs and rigid portion serially extend in the respective direction from the respective bonding pad to the respective linking unit. This configuration prevents buckling of the flat springs under load, and facilitates flexing of the flat springs in the "horizontal" direction, thereby more effectively limiting deformation of the optical element.

Each bonding member desirably further comprises third and fourth spring members extending from the bonding pad in respective directions to the respective linking unit. In this configuration the third and fourth spring members desirably extend from the bonding pad in respective directions, along a line parallel to an axis of the optical element, to the respective linking unit. Each spring member in this configuration can comprise a respective rigid portion flanked by respective flat springs, wherein the flat springs and rigid portion serially extend in the respective direction from the respective bonding pad to the respective linking unit.

Further desirably, each bonding pad has a segmented bonding surface that is bonded to the respective bonding location on the mounting surface of the optical element. Providing the bonding pad with a segmented bonding surface can be achieved by defining a series of intersecting grooves defined in the bonding surface. The segmented bonding surface reduces shrinkage of the surface during curing of the bonding agent, which reduces deformation of the optical element. The bonding agent desirably is an epoxy adhesive or the like that does not contribute volatiles to a vacuum environment after curing.

The mounting further can comprise a mounting member attached to the optical column, wherein the holding devices are attached to respective locations on the mounting member. Desirably, at least three holding devices are arranged at respective equi-angular locations on the mounting member relative to the mounting surface. The mounting member can be coupled to a mounting flange of the optical column. For optimal ability of the mounting flange to absorb stress, the mounting flange desirably has a thickness of no greater than $\frac{1}{10}$ a thickness of the mounting member. A spacer or analogous component can be interposed between the optical column and the mounting flange.

With respect to each holding device, the respective spring members of the bonding member can be attached to the respective linking unit such that a gap is defined between the bonding member and the linking unit, thereby providing a configuration in which the bonding pad is suspended by the respective spring members relative to the linking unit.

In an optical-element mounting as summarized above the flat springs are deformed easily relative to the optical element, especially in a radial direction relative to an axis of the optical element. Hence, if the optical element has experienced thermal expansion, the strain is transmitted to and absorbed by the flat springs and not transmitted to the optical column (from which stress can be transmitted back to the optical element). Thus, local deformation of the optical element mounted in the optical column is prevented. This benefit is especially important in preventing non-uniform thermal deformation of the optical element, which otherwise can cause substantial non-uniform wavefront aberrations that are difficult to correct.

An optical-element mounting according to another embodiment is especially suitable for holding an optical element having multiple mounting protrusions extending from respective locations on the periphery of the optical element. The mounting comprises a respective holding device mounted to each mounting protrusion. Each holding device comprises a first respective spring-loaded support member supporting the optical element relative to the optical column. The first spring-loaded support members are configured to provide rigid support of the respective mounting protrusions in a gravity direction (a "Z-direction") while providing flexible support of the respective mounting protrusions in directions tangential to the periphery at the respective location, in a radial direction of the optical element at the respective location, and in a tilt direction, relative to the axis, of the optical element at the respective location. Each holding device also comprises at least a second respective spring-loaded support member supporting the respective mounting protrusion relative to the optical column. Each second spring-loaded support member is configured to provide rigid support of the respective mounting protrusion in directions tangential to the periphery at the respective location while providing flexible support of the respective mounting protrusion in the gravity direction and in the radial direction at the respective location.

By making the first spring-loaded support members flexible in directions other than the gravitational direction, the mounting is rendered capable of absorbing warp that otherwise would occur whenever the optical element is attached to the mounting (e.g., warp that arises from differences in the flatness of a mounting relative to the flatness of the respective mounting protrusion held by the mounting. This warp absorption is achieved by deformation of the spring-loaded support members, which prevents stress from being redirected back to the optical element being held in the mounting.

Each holding device further can comprise a third respective spring-loaded support member supporting the respective mounting protrusion relative to the optical column. Each third spring-loaded support member is configured to provide, in conjunction with the second spring-loaded support member, rigid support of the optical element in directions tangential to the periphery at the respective location while providing flexible support of the respective mounting protrusion in the gravity direction and in the radial direction at the respective location.

Each of the first and second spring-loaded support members desirably comprises a respective two pairs of flat springs. In this configuration each pair of flat springs desirably comprises respective first and second flat springs serially arranged in a respective longitudinal direction in which the respective support member provides rigid support for the optical element, while being flexibly compliant in the directions in which the respective spring-loaded support member provides flexible support for the optical element.

Each of the respective first and second flat springs in each pair thereof further can comprise, in serial connection, a rigid portion flanked by the respective first and second flat springs. In such a configuration, the flat springs deform easier as required, which reduces deformation of the optical element.

With respect to each of the first and second spring-loaded support members, each of the first and second flat springs in each pair of flat springs can be configured as a respective two-dimensional flat spring. In this configuration the first and second flat springs in each pair desirably are perpendicular to each other in respective orthogonal directions that are mutually perpendicular to each other and to the longitudinal direction.

Each of the respective first and second flat springs in each pair thereof can comprise, in serial connection, a rigid portion flanked by the respective first and second flat springs.

With respect to each of the spring-loaded support members, the constituent two pairs of flat springs desirably have a center that is aligned with the center of the respective protrusion. In addition to simple pushing and pulling forces that are experienced, external moment forces act on the optical element. These external forces may adversely affect the shape of the optical element. By aligning the centers of the flat springs and the protrusions, excessive forces are not generated at the protrusions, which minimizes deformation of the optical element.

Desirably, at least three holding devices are arranged equi-angularly around the periphery of the optical element. This configuration provides support for the optical element in all horizontal directions.

An optical-element mounting of yet another embodiment comprises a respective holding device comprising a respective clamping-support unit mounted to each mounting protrusion. Each clamping-support unit comprises opposing first and second contact portions situated and configured to contact respective surfaces of the respective mounting protrusion. Each clamping-support unit is sufficiently compliant to allow tilting of the respective first and second contact portions relative to the respective surfaces of the respective mounting protrusion. In each clamping-support unit, at least one of the respective first and second contact portions comprises at least one respective flat spring supporting the respective contact portion in the clamping-support unit. The respective flat spring provides the compliance of the respective clamping-support unit.

In each clamping-support unit, the respective first and second contact portions desirably are configured to accommodate tilting of the optical element relative to the optical column. Also, in each clamping-support unit, the respective first and second contact portions desirably are configured to accommodate rotational movement of the optical element about the axis relative to the optical column. Further desirably, in each clamping-support unit, the respective first and second contact portions are configured to accommodate tilting of the optical element relative to the optical column.

The mounting further can comprise a tightenable fastener associated with each clamping-support unit mounted to a respective mounting protrusion. The tightenable fastener is configured for adjustment of a clamping force with which the clamping-support unit is mounted to the respective protrusion. The relative clamping force is revealed by a degree of tilt of at least one of the respective first and second contact portions.

Each holding device further can comprise a first respective spring-loaded support member supporting the optical element relative to the optical column. The first spring-loaded support member desirably is configured to provide rigid support of the respective mounting protrusion in a gravity direction while providing flexible support of the respective mounting protrusion in directions tangential to the periphery at the respective location, in a radial direction of the optical element at the respective location, and in a tilt direction, relative to the axis, of the optical element at the respective location. Each holding device also desirably includes at least a second respective spring-loaded support member supporting the respective mounting protrusion relative to the optical column. Each second spring-loaded support member is configured to provide rigid support of the respective mounting protrusion in directions tangential to the periphery at the respective location while providing flexible support of the respective mounting protrusion in the gravity direction and in the radial direction at the respective location.

By clasping the mounting protrusions of the optical element using clamping-support members, use of bonding agents and the like is avoided. Hence, these configurations are useful whenever the optical element is to be used in a vacuum environment. Also, not using a bonding agent simplifies replacement of a damaged optical element. The tiltability of the clamping-support members relative to the mounting protrusions eliminates the need to use excessive mounting force applied to the optical element, which reduces deformation of the optical element.

The holding devices summarized above also allow measurements of the force with which the mounting protrusions are being held by respective holding devices (wherein force is a function of the degree of flex of the flexible members). Thus, the holding forces can be equalized at all locations on the element.

According to another aspect of the invention, optical systems are provided. A first embodiment of such a system comprises an optical column that comprises a mounting member. The system also includes an optical element having a mounting surface, and an optical-element mounting serving to mount the optical element to the mounting member and thus to the optical column. The mounting comprises multiple holding devices arranged at respective locations relative to the mounting surface. Each holding device comprises a respective linking unit extending from a respective location on the mounting member and a respective bonding member attached to a respective bonding location on the mounting surface. Each bonding member comprises a bonding pad bonded to the respective bonding location on the mounting surface, and at least first and second spring members extending from the bonding pad in respective directions to the linking unit.

This optical system further can comprise at least one shape-adjustment mechanism situated relative to a respective holding device and to the mounting member. The shape-adjustment mechanism can comprise an actuator configured, when energized, to move the respective holding device relative to the mounting member and thus apply a moment to a respective portion of the optical element supported by the respective holding device so as to impose or change a shape error of the optical element. Thus, the shape error of the optical element can be adjusted or compensated, thereby facilitating achievement of the desired wavefront aberration and resolving power exhibited by the optical element. It is also possible with this configuration deliberately to deform the optical element by applying a respective displacement to the spring-loaded support members using the actuator. Such deformation of the optical element causes a corresponding change in wavefront aberration of the element, allowing the desired wavefront aberration to be obtained.

The optical system further can comprise at least one position-adjustment mechanism situated relative to the mounting member and the optical column. The position-adjustment mechanism comprises: (a) an actuator configured, when energized, to move and thus apply a displacement force to a respective location on the mounting member relative to the optical column, and thus to a respective location on the optical-element mounting; and (b) a drive-limiter mechanism serving to reduce a movement distance imparted to the respective location on the mounting member relative to a corresponding movement distance of the actuator.

An optical system according to another embodiment comprises an optical column comprising a mounting member. The system also includes an optical element having mounting protrusions extending from respective locations on the periphery, and an optical-element mounting serving to mount the optical element to the mounting member. The mounting comprises a respective holding device mounted to each mounting protrusion. Each holding device comprises a respective first spring-loaded support member supporting the optical element relative to the mounting member. The first spring-loaded support member is configured to provide rigid support of the respective mounting protrusion in a gravity direction while providing flexible support of the optical element in directions tangential to the periphery at the respective locations, in a radial direction of the optical element at the respective location, and in a tilt direction, relative to the axis, of the optical element at the respective location. Each holding device also comprises at least a respective second spring-loaded support member supporting the optical element relative to the mounting member. Each second spring-loaded support member is configured to provide rigid support of the optical element in directions tangential to the periphery at the respective location while providing flexible support of the optical element in the gravity direction and in the radial direction at the respective location. Each of the spring-loaded support members desirably comprises at least two respective flat springs oriented perpendicularly to each other.

This optical system further can comprise at least one shape-adjustment mechanism situated relative to a respective holding device and to the mounting member. The shape-adjustment mechanism comprises an actuator configured, when energized, to move the respective holding device relative to the mounting member and thus apply a moment to a respective portion of the optical element supported by the respective holding device so as to impose or change a shape error of the optical element. The shape-adjustment mechanism can be configured to apply a displacement, in a direction perpendicular to the gravity direction, to at least one of the first spring-loaded support members.

This optical system further can comprise at least one position-adjustment mechanism situated relative to the mounting member and the optical column, the position-adjustment mechanism comprises: (a) an actuator configured, when energized, to move and thus apply a displacement force to a respective location on the mounting member relative to the optical column, and thus to a respective location on the optical-element mounting; and (b) a drive-limiter mechanism serving to reduce a movement distance imparted to the respective location on the mounting member relative to a corresponding movement distance of the actuator.

Another embodiment of an optical system comprises an optical column comprising a mounting member, an optical element having multiple discrete mounting protrusions extending from respective locations on the periphery, and an optical-element mounting serving to mount the optical element to the mounting member and thus to the optical column. The mounting comprises, for each of multiple mounting protrusions, a respective holding device comprising a respective clamping-support unit mounted to each mounting protrusion. Each clamping-support unit comprises opposing first and second contact portions situated and configured to contact respective surfaces of the respective mounting protrusion. Each clamping-support unit is sufficiently compliant to allow tilting of the contact portions relative to the respective surfaces of the respective mounting protrusion.

This embodiment of an optical system further can comprise at least one shape-adjustment mechanism situated relative to a respective holding device and to the mounting member. The shape-adjustment mechanism comprises an actuator configured, when energized to move the respective holding device relative to the mounting member and thus apply a moment to a respective portion of the optical element supported by the respective holding device so as to impose or change a shape error of the optical element.

Each holding device further can comprise at least one respective first spring-loaded support member supporting the optical element relative to the mounting member. Each such spring-loaded support member is configured to provide rigid support of the respective mounting protrusion in a gravity direction while providing flexible support, relative to the mounting member, of the respective mounting protrusion in directions tangential to the periphery at the respective locations, in a radial direction of the optical element at the respective location, and in a tilt direction, relative to the axis, of the optical element at the respective location. Each holding device further can comprise at least a respective second spring-loaded support member supporting the respective mounting protrusion relative to the mounting member, wherein each such second spring-loaded support member is configured to provide rigid support, relative to the mounting member, of the respective mounting protrusion optical element in directions tangential to the periphery at the respective location while providing flexible support of the respective mounting protrusion in the gravity direction and in the radial direction at the respective location.

The optical system further can comprise at least one shape-adjustment mechanism situated relative to a respective holding device and to the mounting member. The shape-adjustment mechanism can be configured as summarized above. The shape-adjustment mechanism can be configured to apply a displacement, in a direction perpendicular to the gravity direction, to at least one of the first spring-loaded support members. As noted above, each of the spring-loaded support members desirably comprises at least two respective flat springs oriented perpendicularly to each other.

The optical system further can comprise at least one position-adjustment mechanism situated relative to the mounting member and the optical column. The position-adjustment mechanism comprises: (a) an actuator configured, when energized, to move and thus apply a displacement force to a respective location on the mounting member relative to the optical column, and thus to a respective location on the optical-element mounting; and (b) a drive-limiter mechanism serving to reduce a movement distance imparted to the respective location on the mounting member relative to a corresponding movement distance of the actuator.

Yet another embodiment of an optical system comprises an optical column comprising a mounting member, an optical element, an optical-element mounting serving to mount the optical element to the mounting member and thus to the optical column, and at least one shape-adjustment mechanism situated relative to the optical-element mounting and to the mounting member. The shape-adjustment mechanism comprises an actuator configured, when energized, to apply a moment to a portion of the optical element supported by the mounting so as to impose or change a shape error of the optical element. If the optical element defines multiple mounting protrusions, then the optical-element mounting can comprise, for each mounting protrusion of the optical element, at least one respective spring-loaded support member situated and configured to hold and support the respective mounting protrusion relative to the mounting member rigidly in a gravity direction and flexibly in a horizontal direction perpendicular to the gravity direction. In this embodiment the shape-adjustment mechanism desirably comprises an actuator situated and configured to apply, when energized, a displacement in the horizontal direction to at least one spring-loaded support member.

Yet another embodiment of an optical system comprises an optical column comprising a mounting member, an optical element, an optical-element mounting serving to mount the optical element to the mounting member and thus to the optical column, and at least one position-adjustment mechanism situated relative to the mounting member and thus to the optical column. The position-adjustment mechanism comprises: (a) an actuator configured, when energized, to move and thus apply a displacement force to a respective location on the mounting member relative to the optical column, and thus to a respective location on the optical-element mounting, and (b) a drive-limiter mechanism serving to reduce a movement distance imparted to the respective location on the mounting member relative to a corresponding movement distance of the actuator.

The drive-limiter mechanism desirably comprises a lever connecting the actuator to the respective location on the mounting. The lever desirably has a fulcrum connected to the optical column by a flat spring. This embodiment provides the position-adjustment mechanism with substantially zero backlash as a result of using the flat-spring fulcrum. Such a fulcrum also allows fine adjustments to be performed easily by compressing the flat spring. This configuration also is highly stable after performing position adjustment. The lever secures a fixed status by fixing the vicinity of the point where force is applied. As a result, even if positional misalignment has occurred during position-fixing, the misalignment itself is reduced. Since the fixing force of the lever is inversely proportional to compression, it is possible to ensure sufficient fixing force with an appropriate lever force.

The position-adjustment mechanism desirably comprises a mechanism that adjusts one or more of an X-position, a Y-position, a Z-position, a $\theta_x$-position, a $\theta_y$-position, and a $\theta_z$-position of the mounting member, and thus the optical element, relative to the optical column. For example, the position-adjustment mechanism can comprise X-, Y-, $\theta_z$-adjustment mechanisms for adjusting the X-, Y-, and $\theta_z$-position, respectively, of the mounting member, and thus the optical element, relative to the optical column. By way of another example, the position-adjustment mechanism can comprise Z-, $\theta_x$-, $\theta_y$-adjustment mechanisms for adjusting the Z-, $\theta_x$-, and $\theta_y$-position, respectively, of the mounting member, and thus the optical element, relative to the optical column. By way of another example, both these mechanisms can be provided, in which instance the X-, Y-, $\theta_z$-adjustment mechanisms and the Z-, $\theta_x$-, $\theta_y$-adjustment mechanisms can be arranged in parallel.

Further by way of example, each of the Z-, $\theta_x$-, $\theta_y$-adjustment mechanisms can comprise a respective spring-loaded support member that supports the mounting member, and thus the optical element, in a Z-direction relative to the optical column. Each such spring-loaded support member desirably supports the mounting member rigidly in a gravity direction and flexibly in a horizontal direction perpendicular to the gravity direction. Furthermore, each spring-loaded support member can comprise a respective two-dimensional flat spring comprising a pair of flat springs oriented perpendicularly to each other.

The optical system further can comprise a position-fixing mechanism situated relative to the mounting member and the optical column and configured to fix the position of the mounting member, and thus the optical element, relative to the optical column. The position-fixing mechanism can comprise at least three fixing members each comprising multiple respective flat springs collectively exhibiting a degree of freedom of motion in a respective direction, wherein the respective degree of freedom of motion of each position-fixing mechanism is different one from the other.

According to another aspect of the invention, microlithographic-exposure systems are provided for selectively irradiating an energy beam to a sensitive substrate to imprint a pattern on the substrate. The microlithographic-exposure system comprises an optical system as summarized above. The microlithographic-exposure system can use EUV light as the energy beam, but the systems are not so limited. The energy beam alternatively can be a beam of ultraviolet light, an electron beam, an ion beam, etc. Furthermore, the exposure system may be a reduction-projection exposure or proximity lithography system.

The foregoing and additional features and advantages of the invention will be more readily apparent from the following detailed description, which proceeds with reference to the accompanying drawings.

BRIEF DESCRIPTION OF THE DRAWINGS

FIGS. 9(A)–9(D) depict details of the spring-loaded support member (having characteristics of a two-dimensional flat spring) of the mounting shown in FIGS. 3 and 4, wherein FIG. 9(A) is a "front" elevational view, FIG. 9(B) is a side elevational view, FIG. 9(C) is a "top" view, and FIG. 9(D) is a "bottom" view.

FIGS. 11(A) and 11(B) are respective orthogonal schematic elevational views showing certain features and action of a representative embodiment of a two-dimensional actuator situated between a spring-loaded support member and a mounting member, the actuator being configured to impart, when energized, a shape adjustment to the optical element being held by a mounting attached to the support member.

DETAILED DESCRIPTION

Various aspects of the invention are described below in the context of multiple representative embodiments that are not intended to be limiting in any way. It will be understood herein that denotations of "top," "bottom," "left," "right," "vertical," and "horizontal" are for convenience in referring to the depictions in the figures, and are not intended to impose any positional or orientational limitations, unless otherwise noted.

First Representative Embodiment

Figure 1A:
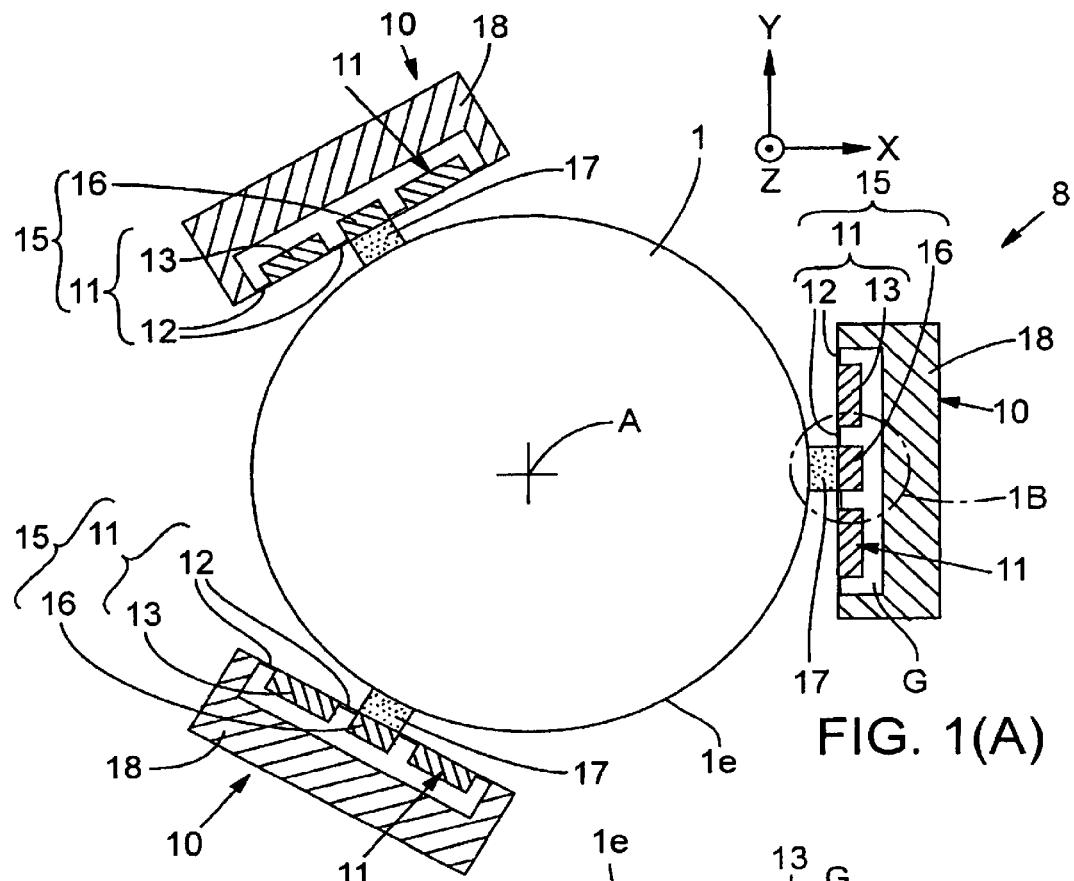
FIG. 1(A) is a plan view of a first representative embodiment of an optical-element mounting for holding an optical element (e.g., a mirror) in an optical column of an optical system.
Figure 1B:
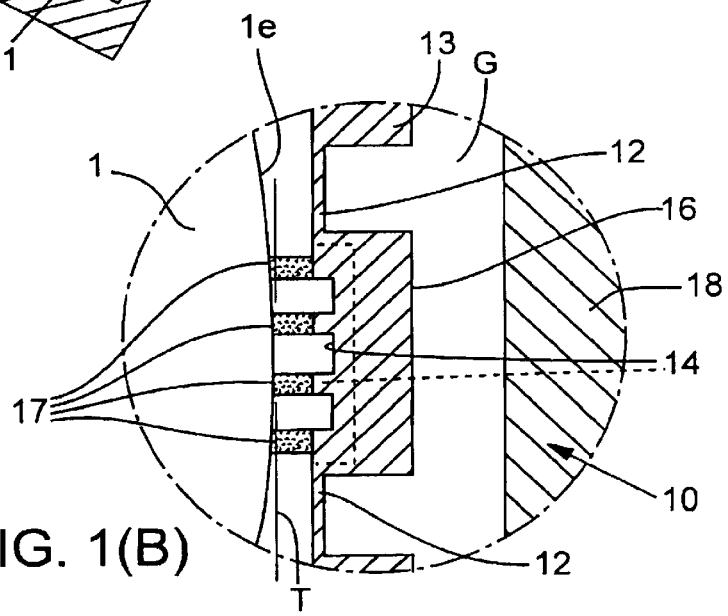
FIG. 1(B) is an enlargement showing detail of a bonding pad and of the manner in which the bonding pad is attached to the optical element.
Figure 2A:
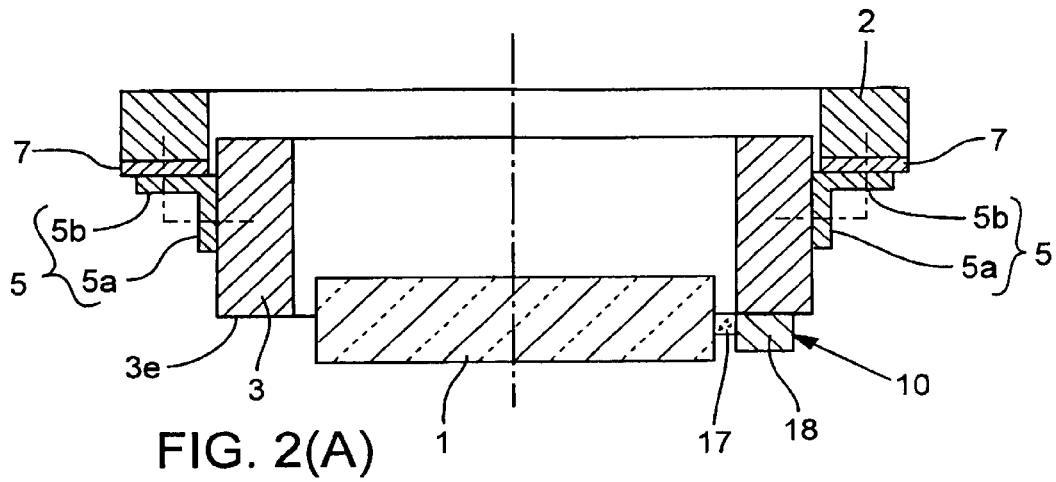
FIG. 2(A) is an elevational section showing an optical element mounted to a mounting member using the embodiment of an optical-element mounting shown in FIG. 1(A), wherein the mounting member is attached to an annular member of the optical column using a flange.
Figure 2B:
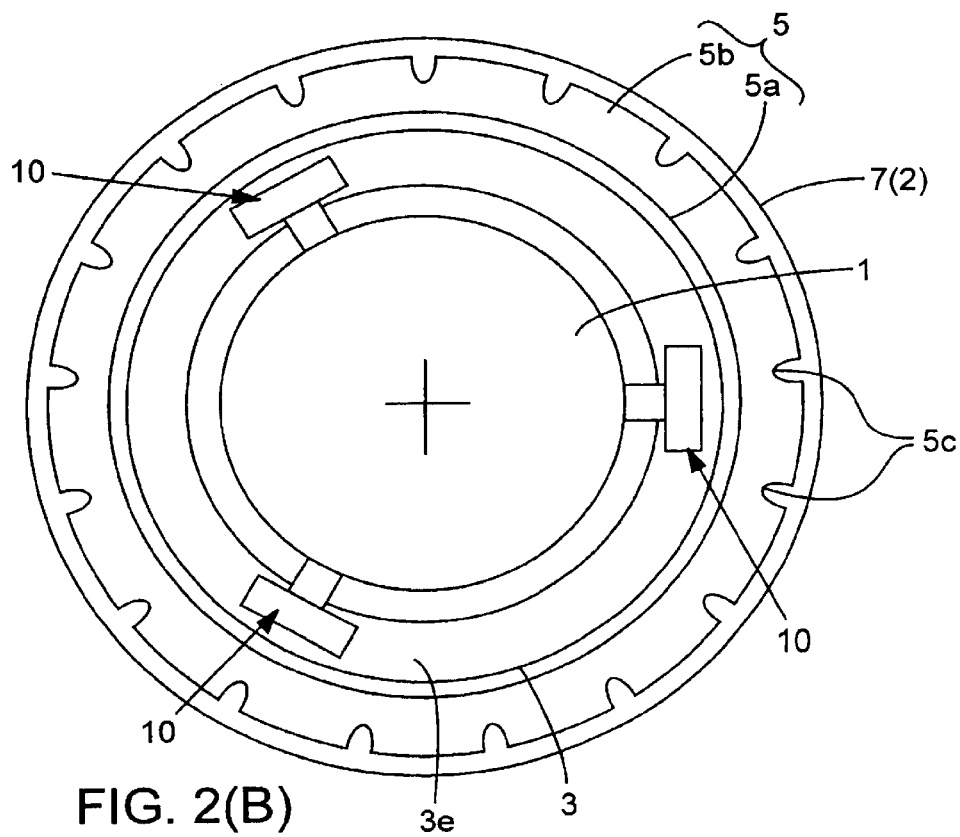
FIG. 2(B) is a plan view of the assembly shown in FIG. 2(A).

An optical-element mounting according to this representative embodiment is depicted in FIGS. 1(A)–1(B) and 2(A)–2(B), in which the depicted optical element is, by way of example, a plate-shaped mirror 1. The mirror 1 is shown as it would be mounted within an optical column (not shown) of an optical system. Referring to FIGS. 1(A) and 2(B), the mirror 1 is mounted to the optical column by an optical-element mounting 8 comprising three holding devices 10 arranged equi-angularly (120° intervals) relative to each other around the circumference of the mirror 1. The mounting 8 serves to hold and support the mirror 1 to a mounting member 3 (having a cylindrical configuration in this embodiment), which in turn is attached to a flange 5 (having an annular configuration in this embodiment) of an optical column, discussed later below (FIG. 2(A)).

Details of the mounting 8 are shown in FIGS. 1(A)–1(B). Each holding device 10 of the mounting 8 comprises a linking unit 18 attached, in this embodiment, to a respective location on an axial-end surface 3e of the mounting member 3 (FIG. 2(B)). The linking unit 18 defines a gap G spanned by a bonding member 15. The bonding member 15 comprises a centrally located bonding pad 16 flanked by spring members 11. Each spring member 11 comprises a relatively thick, rigid portion 13 flanked by relatively thin flat springs 12. The spring members 11 extend in opposite directions from the bonding pad 16 (e.g., in respective directions parallel to a tangent line T and in respective directions parallel to the axis A of the mirror). Each bonding pad 16 faces the mirror 1 and is bonded to a respective bonding location on a "mounting surface" exemplified by the circumferential side surface 1e of the mirror 1.

The surface of the bonding pad 16 facing the optical element 1 defines multiple, intersecting grid-like grooves 14 (FIG. 1(B)) that effectively divide the surface of the bonding pad 16 into multiple segments. (Note that grooves 14 in this embodiment extend not only in the Y-direction but also in the Z-direction in the figure.) This divided surface of the bonding pad 16 is bonded to the respective bonding location on the circumferential side surface 1e of the mirror 1 using a suitable bonding agent (adhesive) 17. (In FIGS. 1 and 2(A), the depicted thickness of the bonding agent 17 is exaggerated for clarity.) By bonding the mounting surface of the mirror to a divided surface (rather than to a non-divided surface) of the bonding pad 16 in this manner, stress to the bonding pad 16 during curing of the bonding agent 17 is reduced, resulting in less deformation of the mirror 1 being transmitted to the mirror from the bonding member 15. The bonding agent 17 desirably is a material that exhibits no adverse effect on the optical performance of the mirror 1 or of neighboring components of the optical column. For example, the bonding agent 17 can be a suitable epoxy adhesive. The bonding agent 17 also desirably exhibits little to no outgassing when used in a vacuum environment.

As noted above, the spring members 11 flank the bonding pad 16 in each linking unit 18. In this embodiment, flanking spring members 11 have width and can limit mirror movement in the Z-direction. As noted above, each spring member 11 comprises a rigid portion 13 flanked by flat springs 12. Thus, extending from the bonding pad 16 in each applicable direction to the linking unit 18 are a first flat spring 12, a rigid portion 13, and a second flat spring 12 serially connected together. The length of each rigid portion 13 desirably is at least twice the total lengths of the two flat springs 12 that flank it. The longer and thinner the flat springs 12, the less rigid the respective spring member 11. However, if the flat springs 12 are too thin, an excessive risk is posed of their exhibiting plastic deformation during processing and assembly. Consequently, the spring members 11 are configured to have minimum rigidity while exhibiting acceptably low plastic deformation. Also, the flat springs 12 are configured sufficiently short so as to exhibit minimal buckling.

Under actual-use conditions, the dimensions of the components of the holding devices 10 are established by taking into account the mass, rigidity, and shape of the mirror 1, as well as the required shape accuracy of the mirror 1. By way of example, each flat spring 12 can have a thickness in the range of 0.1 to 1 mm and a length in the range of 1 mm to 10 mm. As noted above, each rigid portion 13 desirably has a length of twice the total lengths of the two flanking flat springs 12. For example, if the mirror 1 has a diameter of 200 mm and an axial length ("thickness") of 30 mm, then each flat spring 12 can have a thickness of 0.5 mm and a length of approximately 3 mm, and each rigid portion 13 can have a length of 15 mm. Data obtained from actual use of optical elements and associated mountings configured according to these dimensions revealed that the mirror 1 exhibited a deformation limited to 1 nm or less.

Referring now to FIGS. 2(A)–2(B), the mounting member 3 is interposed between the mirror 1 and an annular member 2 of the optical column. In this embodiment, the respective linking units 18 of the holding devices 10 are secured to the "lower" axial-end surface 3e of the mounting member 3. The mounting member 3 and the annular member 2 are connected together by the flange 5. The flange 5 comprises a first portion 5a that is affixed (by screws or analogous fasteners, not shown) circumferentially to the outer surface of the mounting member 3 and a second portion 5b that extends radially outward from the first portion 5a and is affixed (by screws or analogous fasteners, not shown) to the axial-end surface of the annular member 2.

The "thickness" of the flange 5 (e.g., radial thickness of the first portion 5a) desirably is 1/10 or less the "thickness" (in the radial direction) of the mounting member 3. As shown in FIG. 2(B), the second portion 5b of the flange 5 desirably defines slits 5c extending radially inwardly. By mounting the mounting member 3 to the annular member 2 using such a flange 5, stress in the mounting member 3 is largely directed toward the flange 5, which (compared to the members 2, 3) is relatively thin and has relatively low rigidity. As a result, corresponding strain in the mounting member 3 is substantially reduced, which correspondingly reduces transmission of stress from the member 3 to the mirror 1, compared to conventional optical columns. It is noted that the slits 5c are not required, but they are desirable in view of their effectiveness in reducing the rigidity of the flange 5, thereby rendering the flange 5 more effective in absorbing stress from the mounting member 3. In other words, stress in the mounting member 3 is directed preferentially (i.e., "biased") toward the flange 5 rather than toward the mirror 1.

FIGS. 2(A) and 2(B) also depict a spacer 7 (e.g., a washer or the like) situated between the second portion 5b of the flange 5 and the axial-end surface of the annular member 2. The spacer 7 physically separates the flange 5 from the annular member 2. This separation, in turn, reduces deformation of the second portion 5b of the flange 5 during attachment of the flange 5 to the annular member 2.

In this embodiment of a holding device 10, the mirror 1 is suspendably mounted, at points of contact of the bonding agent 17 with respective bonding locations on the mirror, via the spring members 11 to the mounting member 3 (and thus to the annular member 2 of the optical column). If the mirror 1 acquires any stress that ordinarily would be directed to the optical column (or if the optical column acquires any stress that ordinarily would be directed to the mirror 1), the stress is absorbed preferentially by the spring members 11, which exhibit strain as required to absorb the stress. This strain of the spring members 11 is especially effective in absorbing stress in the radial direction to or from the mirror 1. Meanwhile, the mirror 1 is adequately supported in all three axes (X, Y, Z) even in situations in which the mirror 1 is exhibiting thermal expansion or the like.

Second Representative Embodiment

Figure 3:
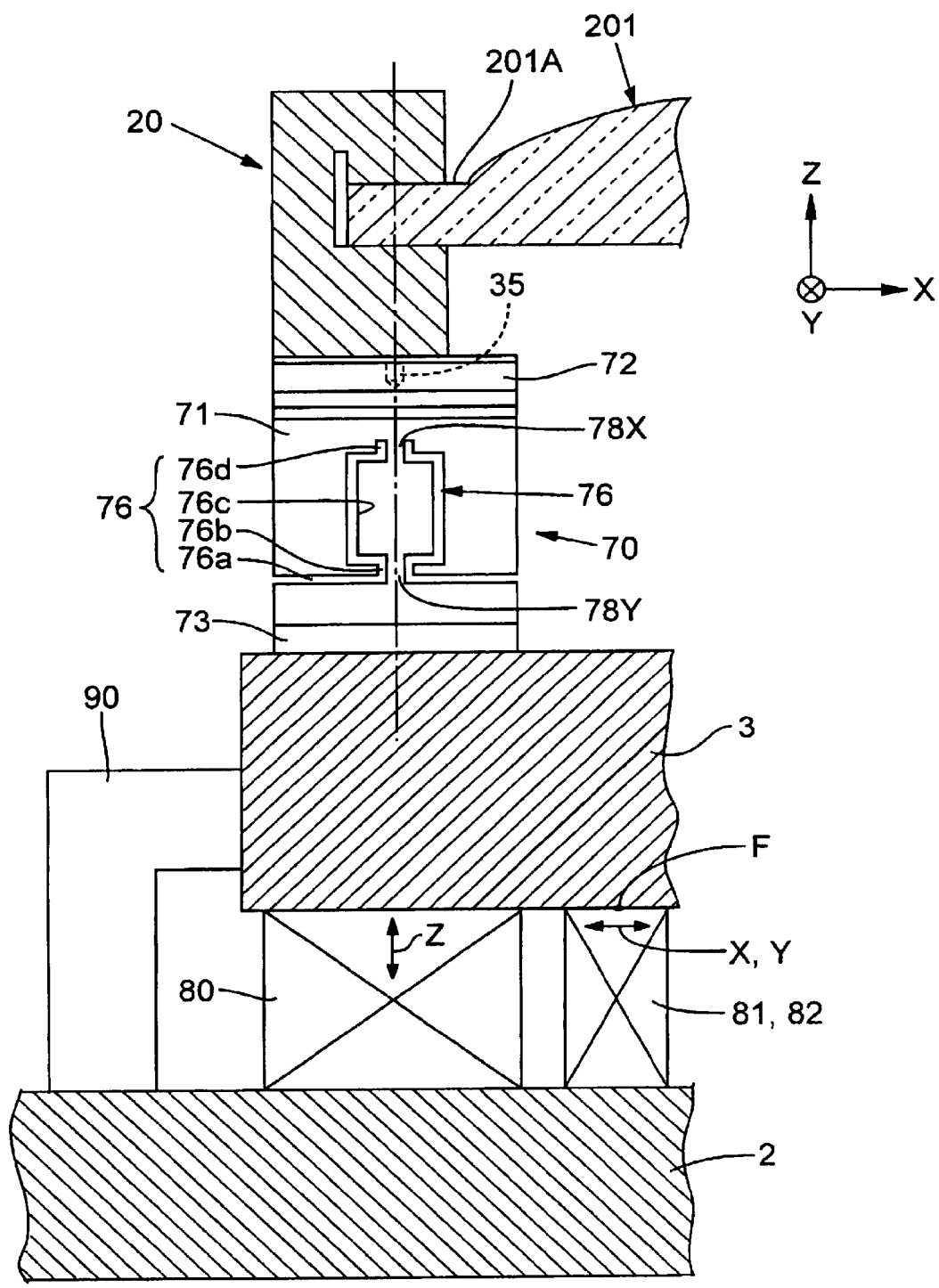
FIG. 3 is an elevational section of a portion of an optical column of an EUV lithography system, showing an optical element (mirror) mounted to a mounting member of the optical column using an optical-element mounting according to a second representative embodiment.
Figure 4:
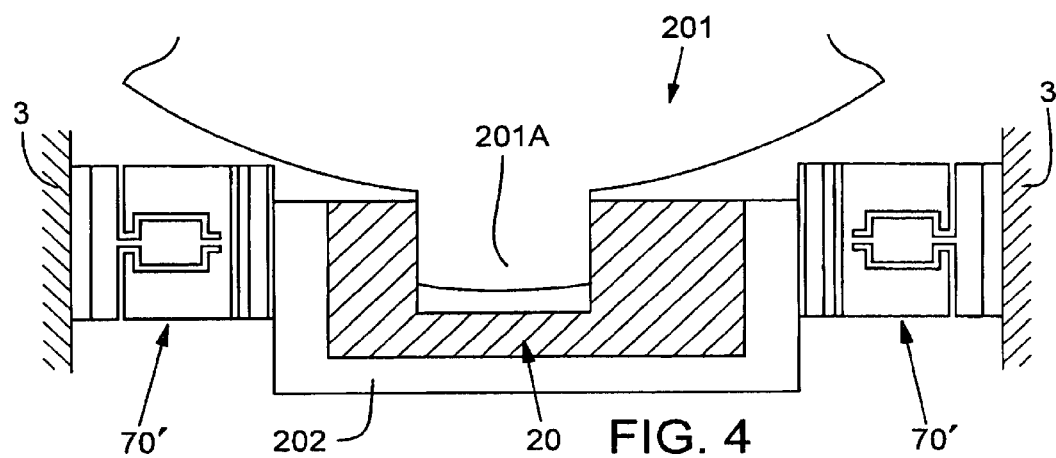
FIG. 4 is a plan view (and partial section) of an optical-element mounting according to the second representative embodiment.

With respect to this embodiment, reference is made first to FIGS. 3 and 4, which show an optical element 201 (e.g., a mirror) that includes multiple mounting protrusions 201A. The mounting protrusions 201A in this embodiment are formed as integral portions of the mirror 201 at three respective locations situated equi-angularly relative to each other around the periphery of the optical element 201. The mounting protrusions 201A are held by respective holding devices of an optical-element mounting according to this embodiment, as described in detail below.

Thus, an optical-element mounting according to this embodiment comprises multiple holding devices 20, which are described below with reference to FIGS. 5–8. Turning first to FIG. 6(A), a "vertical" (extending in the Z-direction) clamping-support unit 21 receives a respective mounting protrusion 201A of the optical element 201. The clamping-support unit 21 includes a first contact portion 22 configured for contacting the "upper" surface of the mounting protrusion 201A and a second contact portion 23 configured for contacting both the "outer" surface and the "lower" surface of the mounting protrusion 201A. In the depicted embodiment the first and second contact portions 22, 23 are connected together by a screw S1 (FIG. 5) or analogous fastener. Alternatively, the contact portions 22, 23 can be integral, which would eliminate the screws S1.

Figure 8:
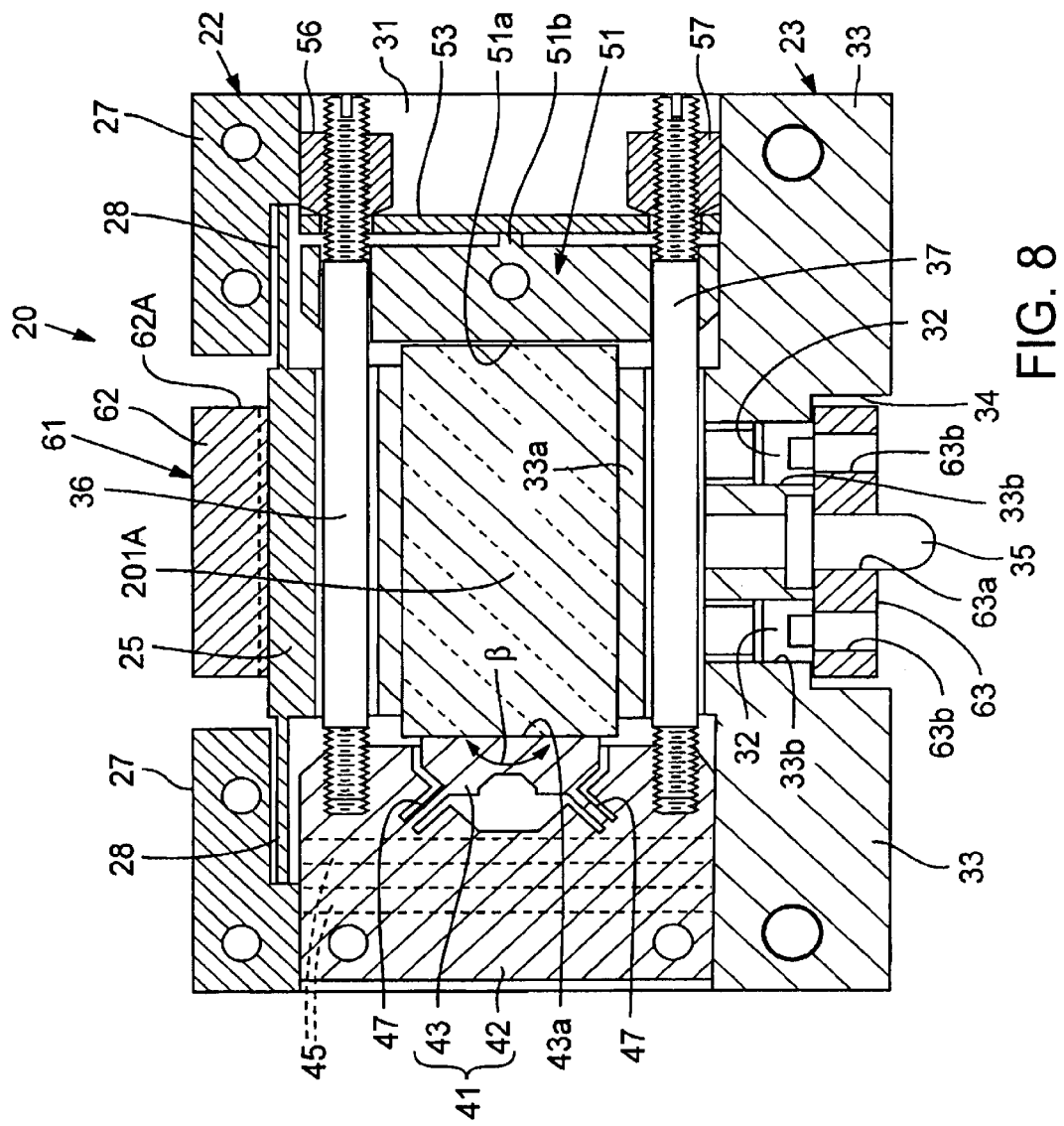
FIG. 8 is a section along the line Z—Z in FIG. 7.

Turning now to FIG. 8, the first contact portion 22 comprises a center region 25 that is configured for contacting the "upper" surface of the mounting protrusion 201A. The center region 25 is flanked by respective end regions 27. The center region 25 and end regions 27 are connected together by respective flat springs 28. The flat springs 28 can be formed by wire-cutting, for example, and facilitate "vertical" displacement of the center region 25 relative to the end regions 27.

Figure 6A:
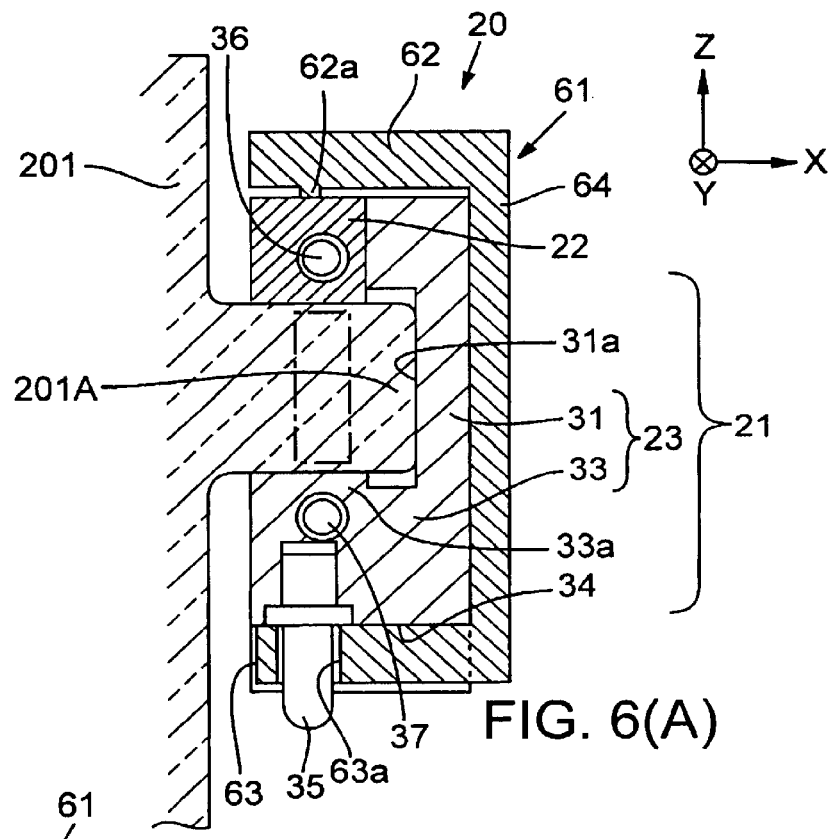
FIG. 6(A) is a section along the line X—X in FIG. 5.
Figure 7:
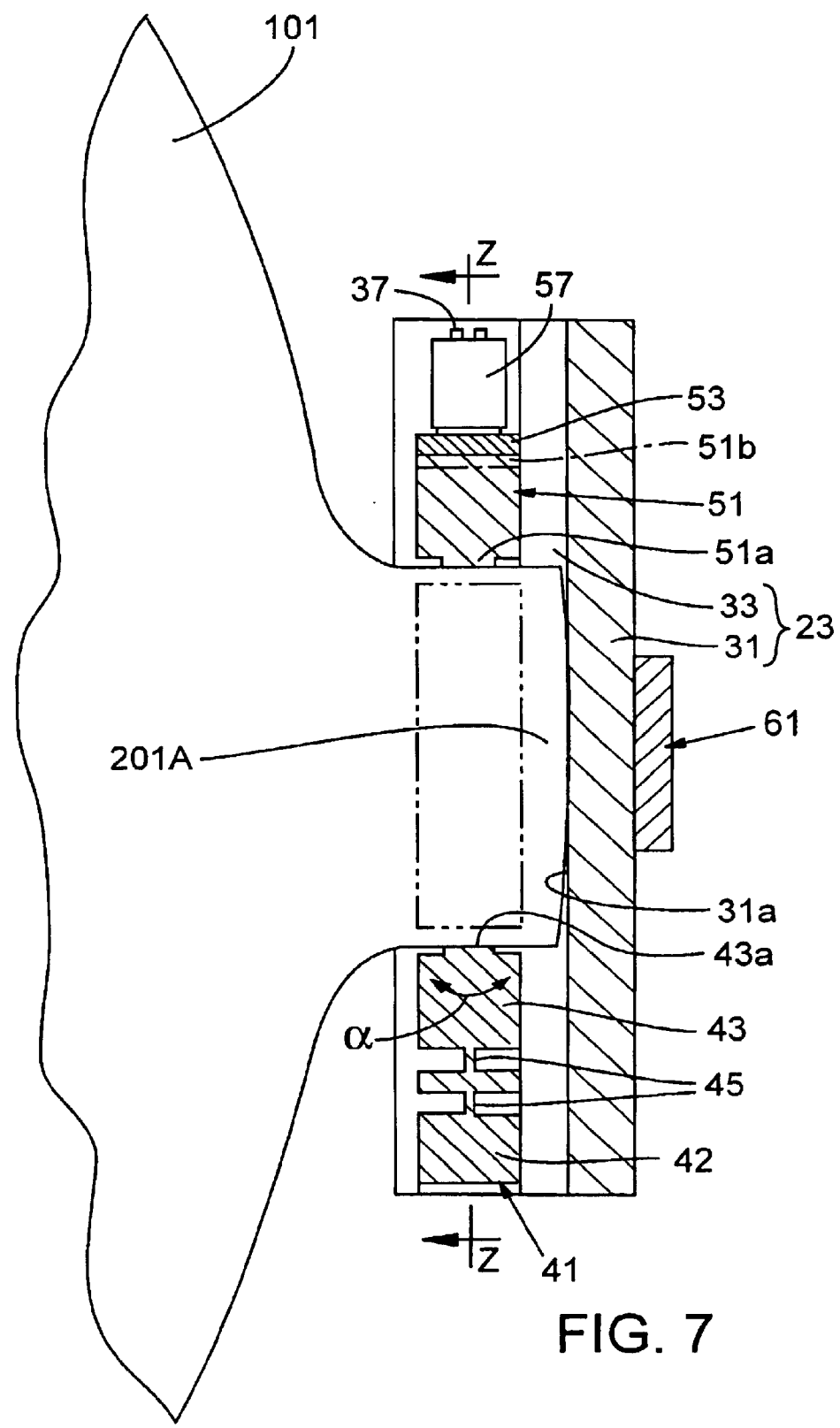
FIG. 7 is a section along the line Y—Y in FIG. 5.

Returning to FIG. 6(A) and referring also to FIG. 7, the second contact member 23 has an approximately L-shaped cross section in the "vertical" direction. The second contact member 23 includes a side 31 situated at and contacting the "outer" surface of the mounting protrusion 201A and a "lower" end 33 situated at and contacting the "lower" surface of the mounting protrusion 201A. The side 31 defines a recess 31a in its "inner" wall, into which recess the distal end of the mounting protrusion 201A is inserted. The lower end 33 defines a protrusion 33a (FIGS. 6(A) and 8) on its "upper" surface. The protrusion 33a is intended to contact the "lower" surface of the mounting protrusion 201A.

Further with respect to FIGS. 6(A) and 8, an upper shaft 36 and a lower shaft 37, each having threaded termini, pass through the center region 25 of the first contact portion 22 and the lower end 33 of the second contact portion 23. The upper and lower shafts 36, 37, discussed later below, are parallel to each other and to the "upper" and "lower" surfaces of the mounting protrusion 201A. In FIG. 8, on the "left" side of the mounting protrusion 201A is a spring-loaded block 41 situated between the end region 27 and the lower end 33. The spring-loaded block 41 is coupled to the side 31 of the second contact member 23 using a screw S2 (FIG. 5) or analogous fastener. The spring-loaded block 41 comprises a main unit 42 and a contact unit 43 having a contact surface 43a intended to contact the "side" surface of the mounting protrusion 201A. The "left" ends of the upper and lower shafts 36, 37, respectively, are threaded into the main unit 42, "above" and "below" the contact unit 43.

The main unit 42 defines flat springs 45 that are situated and configured for accommodating "horizontal" motion of the optical element 201. As can be understood from FIG. 7, the flat springs 45 are defined as residual material of the main unit left after forming grooves that extend toward each other. Desirably, two tandem flat springs 45 are formed. The flat springs 45 allow tilting of the main unit 42 in the direction of arrow α in FIG. 7.

Returning to FIG. 8, the contact unit 43 is coupled by integral flat springs 47 to the main unit 42. The flat springs 47 are oriented to allow the contact unit 43 to tilt in the "vertical" direction (in the direction of the arrow β) relative to the main unit 42. The flat springs 47 can be formed by appropriately cutting the main unit 42 by, e.g., wire cutting. The contact surface 43a extends slightly farther to the right in FIG. 8 than the "right" side surface of the main unit 42 and thus contacts the "right" side surface of the mounting protrusion 201A. As a result of the compliance of the flat springs 47, the contact surface 43a is tiltable over the range β.

Further with respect to FIG. 8, the "right" side of the mounting protrusion 201A contacts a contact member 51 that, with a flexible plate 53, are situated between the end portion 27 of the first contact portion 22 and the lower end 33 of the second contact portion 23. The upper and lower shafts 36, 37, respectively, extend through respective portions of the contact member 51. The contact member 51 defines a protrusion 51a intended to extend toward and contact the "right" side surface of the mounting protrusion 201A. On an opposite surface, the contact member 51 defines a protrusion 51b extending toward and contacting the surface of the flexible plate 53. The contact member 51 is coupled to the second contact portion 23 by a screw S3 (FIG. 5) or analogous fastener.

In FIG. 8 the flexible plate 53 is situated to the "right" of the contact member 51. The upper and lower shafts 36, 37 extend through the flexible plate 53 to allow respective nuts 56, 57 to be threaded onto them. The flexible plate 53 flexes in response to a force applied thereto by the nuts 56, 57. The resulting force exerted by flexing of the plate 53 is transmitted to the protrusion 51b. The shafts 36, 37 pass through respective "clearance" holes extending through the center region 25 of the first contact member 22, the lower end portion 33 of the second contact member 23, and the contact member 51.

Turning again to FIG. 5, two windows 39 are defined in the right-hand side 31 of the clamping-support unit 21. The contact member 51 and the flexible plate 53, as well as the shafts 36, 37 extending therebetween, are visible through the respective windows 39. By measuring dimensions between the contact member 51 and the flexible plate 53 through the windows 39 using a microscope or the like, the magnitude of flex of the flexible plate 53 as a function of respective forces applied by the nuts 56, 57 can be determined. Using such data, the respective clamping forces applied to the mounting protrusion 201A by the spring-loaded block 41 and by the contact member 51, as functions of the magnitude of flex exhibited by the flexible plate 53, can be adjusted as required.

Figure 5:
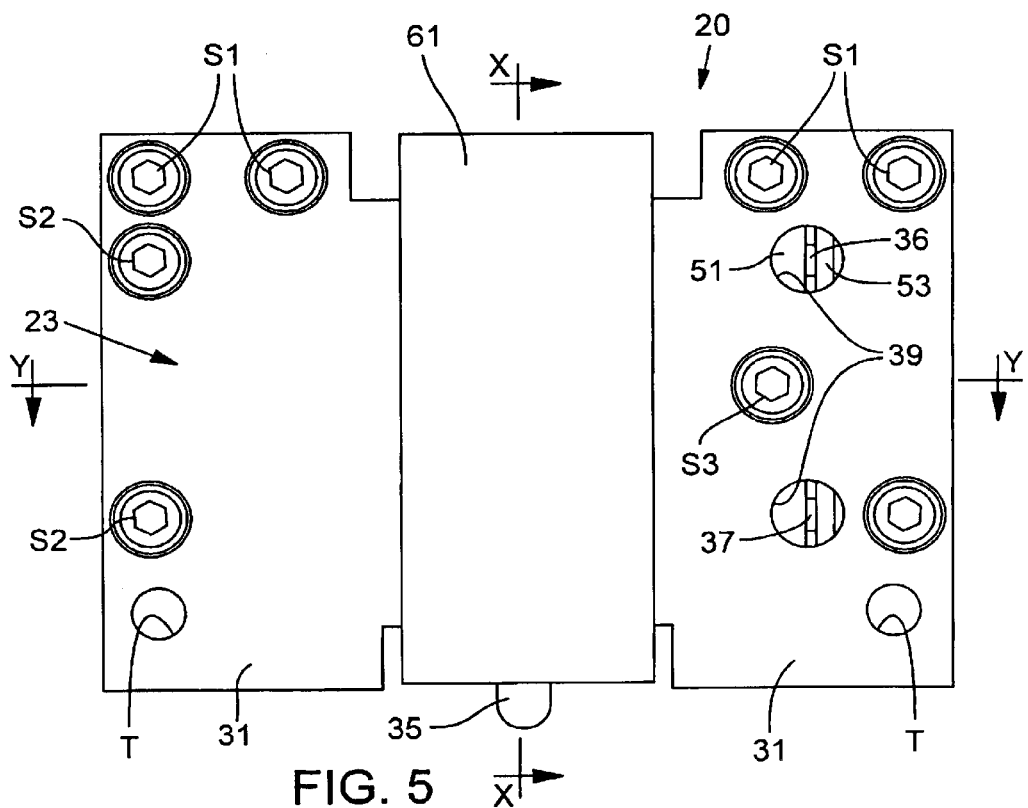
FIG. 5 is an elevational view of the optical-element mounting of the second representative embodiment.

The hole denoted "T" in FIG. 5 is a tapped hole used for joining together the side 31 and a holding member 202 as shown in FIG. 4. The holding member 202 is discussed later below.

As readily understood from FIG. 6(A), a ⊐-shaped outer clamping-support member 61 is situated outboard of the clamping-support member 21. The outer clamping-support member 61 comprises an "upper" end 62 that defines a protrusion 62a for contacting the "upper" surface of the center region 25 of the first contact portion 22. The outer clamping-support member 61 also comprises a "lower" end 63 situated within a recess 34 defined in the lower end 33 of the second contact member 23. The outer clamping-support member 61 also includes a middle region 64 connecting together the upper end 62 and lower end 63.

Turning again to FIG. 8, a middle through-hole 63a and two flanking through-holes 63b are defined in the lower end 63 of the outer clamping-support member 61. A positioning pin 35 is secured to the lower end 33 in a hole that is concentric with the middle through-hole 63a. The distal end of the positioning pin 35 extends "downward" through the middle through-hole 63a. The lower end 33 also includes two screw holes 33b situated on a bolt circle that is approximately concentric with the circle on which the two flanking through-holes 63b of the outer clamping-support member 61 are located. Respective screws 32 are threaded into the screw holes 33b.

The screws 32 can be moved turned within their respective screw holes 33b by inserting a tool into the respective through-holes 63b. Whenever a screw 32 is turned so as to move "downward," the "lower" end of the screw strikes the "upper" surface of the lower end 63 of the outer clamping-support member 61, which results in the lower end 63 being urged downward. The resulting downward force is transmitted to the upper end 62 of the outer clamping-support member 61, which applies a corresponding "downward" force to the mounting protrusion 201A by the protrusion 62a contacting the center region 25 of the first contact portion 22. That is, whenever the screws 32 are turned to effect "lowering," the force applied to the mounting protrusion 201A between the first contact portion 22 and the second contact portion 23 is increased. Conversely, whenever the screws 32 are turned to effect "raising," the "lower" ends of the screws 32 separate from the "upper" surface of the lower end 63. As a result, the force with which the mounting protrusion 201A is held between the first contact portion 22 and the second contact portion 23 is reduced.

Figure 6B:
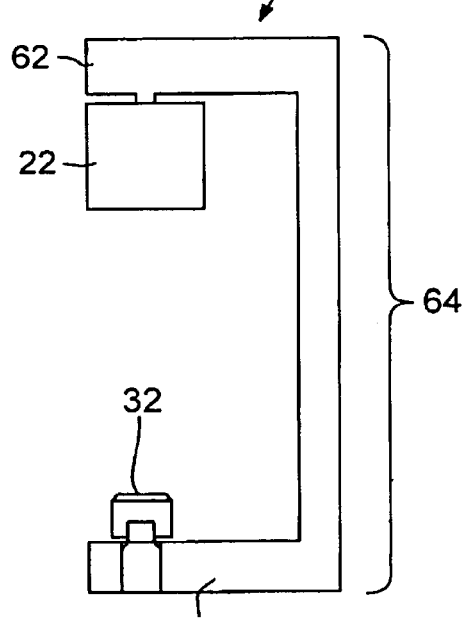
FIGS. 6(B) and 6(C) are respective elevational diagrams schematically depicting (in a greatly exaggerated manner in FIG. 6(C)) the outer clamping support member in a relaxed state and after adjustment to effect clamping action, respectively.
Figure 6C:
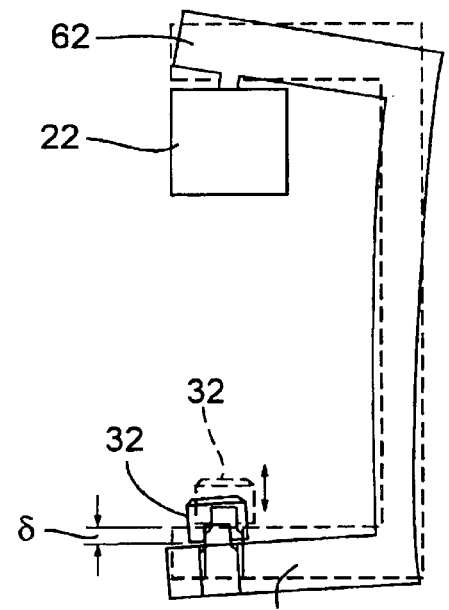

Adjustment of the force applied to the mounting protrusion 201A by the outer clamping-support member 61 accompanying "raising" and "lowering" of the screws 32 is further explained with reference to FIGS. 6(B)–6(C). In FIG. 6(B), until the "lower" end of the screw 32 strikes the "upper" surface of the lower end 63 of the outer clamping-support member 61, the outer clamping support member 61 maintains a normal ⊐-shape. As the screws 32 are "lowered" further, they push the lower end 63 downward, as shown in FIG. 6(C), which causes the middle region 64 to flex, resulting in deformation of the outer clamping-support member 61. The magnitude of this deformation is indicated by δ and is adjustable by appropriately turning the screws 32.

Conventionally, clamping-support units as described above are not used for mounting optical elements; rather, mounting protrusion of optical elements are held directly using a non-compliant screw urged against the mounting protrusion, wherein the force applied to the mounting protrusion is roughly a function of the torque applied to the screw. With such a scheme, even if the torque is equal from one screw to the next in the holding device to which the optical element is mounted, the forces actually applied to the mounting protrusions are not uniform, which makes it difficult to equalize the forces applied to the optical element. As a result, in a conventional optical column, optical elements being held by unequal mounting forces exhibit non-uniform deformation and other strains. In contrast, holding devices 20 as described above allows the forces actually applied against the mounting protrusions of the optical element to be controlled and adjusted easily in a manner allowing a visual indication of the force. This allows a desired mounting force to be obtained reliably. I.e., the holding device 20 allows the optical element to be mounted while avoiding, to an extent greater than heretofore possible, deformation of the optical element.

Thus, as an optical element 201 is held by the holding device 20, each mounting protrusion 201A of the element is clamped along each of four directions: "top," "bottom," "left," and "right." Also, as a result of the compliance of the flat springs 45 and 47 of the spring-loaded block 41 and of the flat spring 28 of the first contact member 22, each mounting protrusion 201A is flexibly and securely clamped along the left, right, top, and bottom directions. This manner of clamping not only restricts local deformation of the mounting protrusions 201A, but also increases the frictional force with which actual contact with the mounting protrusions 201A is made, which limits positional misalignments of the mounting protrusions 201A. The holding device 20 also provides a strong element-holding force as required for proper support of the optical element 201.

The respective compliances of the flat springs 28, 45, 47 maintain deformations of the optical element 201 within an acceptably small range without exerting undue mounting force on the mounting protrusions 201A. This result can be enhanced with the features shown in FIGS. 3–4, which depict the region in the vicinity of one mounting protrusion 201A of the optical element 201. In FIG. 3, a spring-loaded support member 70 is situated "below" the holding device 20. Also, as shown in FIG. 4, respective spring-loaded support members 70' also are situated to the "left" and "right" of the holding device 20.

Referring to FIGS. 9(A)–9(B), each spring-loaded support member 70 comprises a two-dimensional flat-spring configuration comprising two pairs of flat springs that are oriented perpendicularly relative to each other within each support member 70. Each spring-loaded support member 70 also comprises a center-block portion 71 configured as a solid-rectangular parallelepiped. Extending leftward and rightward (the block lengthwise directions) from the "top" and "bottom" of the center-block portion 71 are "upper" and "lower" projections 72, 73. The flat springs in the support member 70 are defined by respective sets of cuts 75, 75' and 76–76' in the center-block portion 71. (The cuts can be formed by, e.g., wire-cutting.) The cuts 75, 75' and 76, 76' are symmetrical relative to respective center lines C1 (FIG. 9(A)) and C2 (see FIG. 9(B)) of the center-block portion 71. By way of example, each cut 75, 75' and 76, 76' has a width of approximately 0.3 mm. Note that the cuts 75, 75' are mutually symmetrical, and the cuts 76, 76' are mutually symmetrical.

By way of example, the cut 75 has segments 75a–75d that are made in the order 75a, 75b, 75c, 75d (FIG. 9(A)). The first cut segment 75a starts just below the upper projection 72 and extends from the side of the center-block portion 71, parallel to the projection 72, to nearly to the center-line C1. The second cut segment 75b extends "downward" 90°, from the first cut segment 75a, parallel to the center-line C1. The third cut segment 75c has a ⊐-shaped profile and extends from the second cut segment away from the center-line C1. The fourth cut segment 75d extends "downward" 90°, from the third cut segment 75c, parallel to the center-line C1 (along the same cut-line as the second cut segment 75b. The cut segments 75a'–75d' are cut in a similar manner but symmetrically to the cut segments 75a–75d. These cuts define flat springs 77X, 77Y between the second cut segments 75b, 75b' and between the fourth cut segments 75d, 75d'.

In a similar manner, the cut 76 has segments 76a–76d that are made in the order 76a, 76b, 76c, 76d (FIG. 9(B)). The first cut segment 76a starts just above the projection 73 and extends from the side of the center-block portion 71, parallel to the projection 73, to nearly to the center-line C2. The second cut segment 76b extends "upward" 90°, from the first cut segment 76a, parallel to the center-line C2. The third cut segment 76c has a ⊐-shaped profile and extends from the second cut segment away from the center-line C2. The fourth cut segment 76d extends "upward" 90°, from the third cut segment 76c, parallel to the center-line C2 (along the same cut-line as the second cut segment 76b. The cut segments 76a'–76d' are cut in a similar manner but symmetrically to the cut segments 76a–76d. These cuts define flat springs 78X, 78Y between the second cut segments 76b, 76b' and between the fourth cut segments 76d, 76d'.

The cuts 75, 75' and 76, 76' facilitate movements of the center-block portion 71 in the directions indicated by the respective arrows shown in FIGS. 9(A) and 9(B), i.e., respective movements in the "horizontal" direction and tilting (rotational) motions. Advantageously, modern wire-cutting methods can form the cuts very accurately without having to apply excessive machining forces to the center-block portion 71. As a result of the two pairs of flat springs formed within the center-block portion 71, the support member 70 is provided with spring compliance in two dimensions.

Turning now to FIGS. 9(C)–9(D), holes 71a, 71b are defined at the respective centers in the "top" and "bottom" surfaces of the projections 72, 73, respectively. The positioning pin 35 (FIG. 3) is inserted into the hole 71a. Also defined in the projections 72, 73 are holes 72a, 73a, respectively, into which holes are inserted respective fixing screws for the spring-loaded support member 70. This is explained with reference to FIGS. 3 and 4. Turning first to FIG. 3, the holding device 20 (into which the mounting protrusion 201A is inserted) and the spring-loaded support member 70 are fastened together such that the positioning pin 35 fits into the hole 71a. This aligns the center of the support member 70 with the center of the positioning pin 35. As a result of this alignment, if a gravitational force or shock were applied to the optical element 201, undue force would not be exerted at points of contact of the holding device 20 with the mounting protrusions 201A, which minimizes deformation of the optical element 201. Since the holding device 20 thus is made integral with the mounting protrusions 201A, the holding device does not warp under such conditions.

The spring-loaded support member 70 attached as shown in FIG. 3 supports the holding device 20 in the gravitational direction with high rigidity while providing flexible support of the optical element 201 in directions that are tangential to the periphery of the optical element 201, in a radial direction of the optical element 201, and in a tilt direction relative to the axis of the optical element 201. Meanwhile, respective spring-loaded support members 70' attached to the "left" and "right" sides of the holding device 20, such as shown in FIG. 4, support the holding device 20 with high rigidity in directions that are tangential to the periphery of the optical element 201 while providing flexible support in the gravitational direction and in the radial direction of the optical element. As a physical force (that otherwise would deform the optical element 201) is directed toward the optical element, the respective spring-loaded support members 70, 70', 70' undergo a corresponding deformation in response to the force. Thus, the support members 70, 70', 70', rather than the optical element 201, exhibit strain (deformation) in response to the force.

Referring further to FIG. 3, the "lower" projection 73 of the spring-loaded support member 70 is secured to the mounting member 3. In addition, position-adjustment mechanisms 80, 81, 82, for adjusting the position of the optical element 201, are situated between the mounting member 3 and the annular member 2 of the optical column. In addition, a position-fixing mechanism 90 is connected between the mounting member 3 and the annular member 2. The position-adjustment mechanism 80 performs Z-direction, $\theta_x$-direction, and $\theta_y$-direction movements that provide respective positional adjustments of the optical element 201. (For X, Y, and Z directions, see FIG. 3.) The position-adjustment mechanisms 81, 82 perform X-direction, Y-direction, and $\theta_z$-direction movements that provide respective positional adjustments of the optical element 201. To such end, by way of example, the position-adjustment mechanism 80 includes an actuator such as a DC motor or a piezo-motor (PZT motor).

If the optical element 201 is a high-precision mirror as used in an EUV optical system, the required positional tolerance of the mirror is extremely small, e.g., approximately 1 μm. If the optical element 201 has a spherical reflective surface, in most cases horizontal misalignment of the mirror causes the same aberration as tilting the mirror. In contrast, if the optical element 201 has an aspherical reflective surface 201, the type and magnitude of aberration arising from mirror misalignments are not always the same. The position-adjustment mechanisms 80, 81, 82 of this embodiment provide horizontal-shift and tilt functions as well as interval-adjustment functions (that is, X, Y, Z, $\theta_x$, $\theta_y$, and $\theta_z$ adjustments). By appropriately adjusting these functions to correct positional errors of the optical element 201, the desired wavefront aberration and resolving power of the element can be obtained.

Figure 10A:
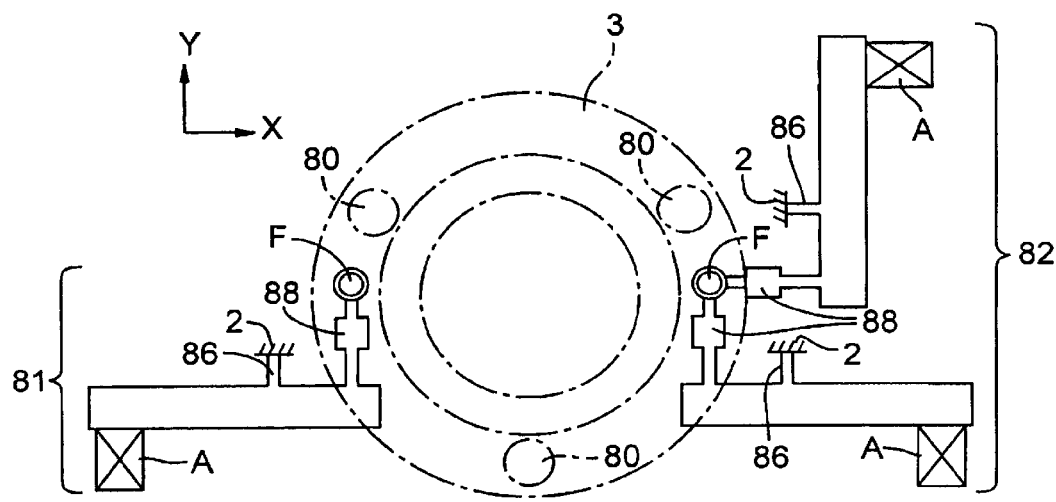
FIG. 10(A) is a plan view depicting a representative embodiment of "horizontal" position-adjustment mechanisms (including details of the lever actions of the mechanisms) connected to a mounting member holding an optical element, the depicted position-adjustment mechanisms being configured to impart X, Y, and $\theta_z$ positional adjustments of the optical element relative to the optical column.
Figure 10B:
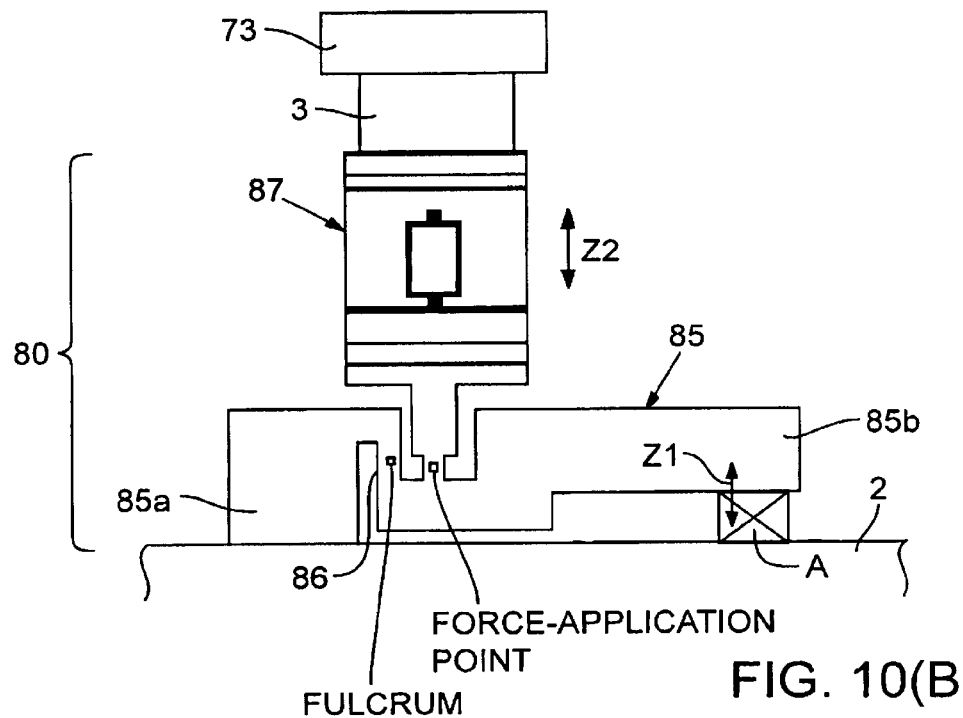
FIG. 10(B) is an elevational view of a representative embodiment of a "vertical" position-adjustment mechanism (including details of the lever action of the mechanism) that (along with at least two other such mechanisms) are connected to a mounting member holding an optical element, the vertical position-adjustment mechanisms being configured to impart Z, $\theta_x$, and $\theta_y$ positional adjustments of the optical element relative to the optical column.

The position-adjustment mechanisms 80, 81, 82 may be individually configured to include respective drive-limiting mechanisms (e.g., lever mechanisms) such as shown in FIGS. 10(A)–10(B). The position-adjustment mechanisms 81, 82 are shown in FIG. 10(A), and the position-adjustment mechanism 80 is shown in FIG. 10(B). The position-adjustment mechanism 81 is a Y-direction lever mechanism, and the position-adjustment mechanism 82 is an X-Y-direction lever mechanism, wherein the mechanisms 81, 82 perform fine adjustment of the X, Y, and $\theta_z$ positions of the optical element 201 as described above. In FIG. 10(B), one of three position-adjustment mechanisms 80 is shown. The position-adjustment mechanisms 80 in this embodiment are arranged at 120° intervals about the mounting member 3, and perform adjustments of the Z, $\theta_x$, and $\theta_y$ positions of the optical element 201. As shown in FIG. 3, the respective position-adjustment mechanisms 80, 81, 82 are situated directly "below" the holding device 20 (note support point F in FIGS. 3 and 10(A)). The position-adjustment mechanism 80 is situated directly "below" the mounting member 3 and serves to reduce the rigidity of the mounting member 3. This depicted position of the mechanism 80 is not intended to be limiting. I.e., the mechanism is not necessarily situated directly "below" the holding device.

The drive-limiting mechanism reduces movements of an actuator A and transmits some of such movements to the mounting member 3. Thus, by adjusting the position of the mounting member 3, the position of the optical element 201 is adjusted. The drive-limiting mechanism comprises a lever 85. As shown in FIG. 10(B), the lever 85 comprises a fixed portion 85a secured to the annular member 2 of the optical column, a movable portion 85b connected to the mounting member 3 via the spring-loaded support member 87, and a flat spring 86 linking together the portions 85a, 85b. The fixed portion 85a and the movable portion 85b are arranged in parallel with each other, flanking the flat spring 86.

Whenever the actuator A of the position-adjustment mechanism 80 is energized, the movable portion 85b of the lever 85 moves in the direction indicated by the arrow Z1 in FIG. 10(B). This movement of the movable portion 85b results in movement of the spring-loaded support member 87 (functioning as a two-dimensional flat spring) in the direction indicated by the arrow Z2 in FIG. 10(B), with the flat spring 86 serving as a fulcrum for the movement. Hence, through the lever action of the lever 85, the motion distance of the movable portion 85b (i.e., the distance of motion imparted by the actuator A) is proportionately reduced as the motion force is transmitted to the support member 70.

In a similar manner, whenever the respective actuators of the position-adjustment mechanisms 81, 82 are energized, a drive force is transmitted to the respective spring-loaded support members 88, which move corresponding distances that are reduced due to the respective lever actions in which the respective flat springs 86 serve as lever fulcrums. These drive forces act on the mounting member 3 at respective support points F from the respective spring-loaded support members (each acting as a respective two-dimensional flat spring). In the position-adjustment mechanism 81, the support member 88 (acting as a two-dimensional flat spring) moves in the Y-direction in FIG. 10(A). In the position-adjustment mechanism 82, the two support members 88 move in respective X- and Y-directions in FIG. 10(A). Thus, the position-adjustment mechanisms 80, 81, 82 achieve fine positional adjustments of the optical element 201.

Figure 12A:
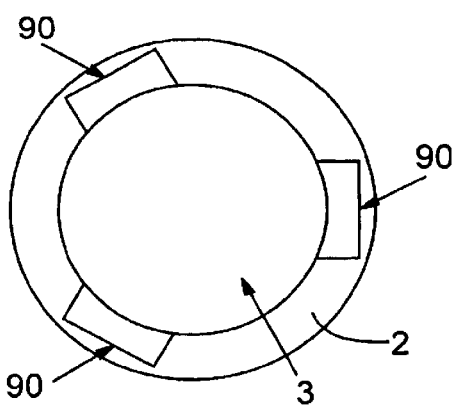
FIG. 12(A) is a schematic plan view of a representative embodiment of a position-fixing mechanism for fixing the position of a mounting member (to which an optical element is mounted) relative to an annular member of the optical column.
Figure 12B:
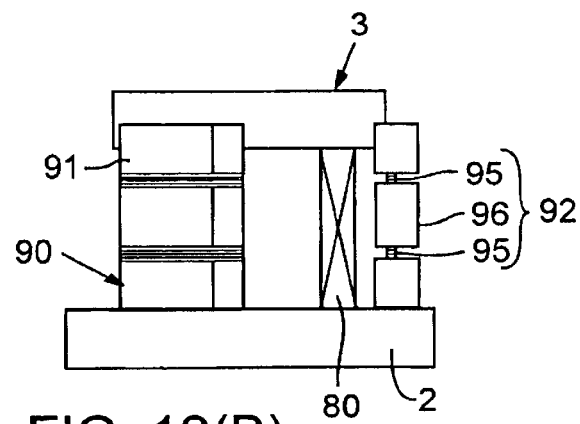
FIG. 12(B) is a schematic elevational view of the mechanism of FIG. 12(A).
Figure 13:
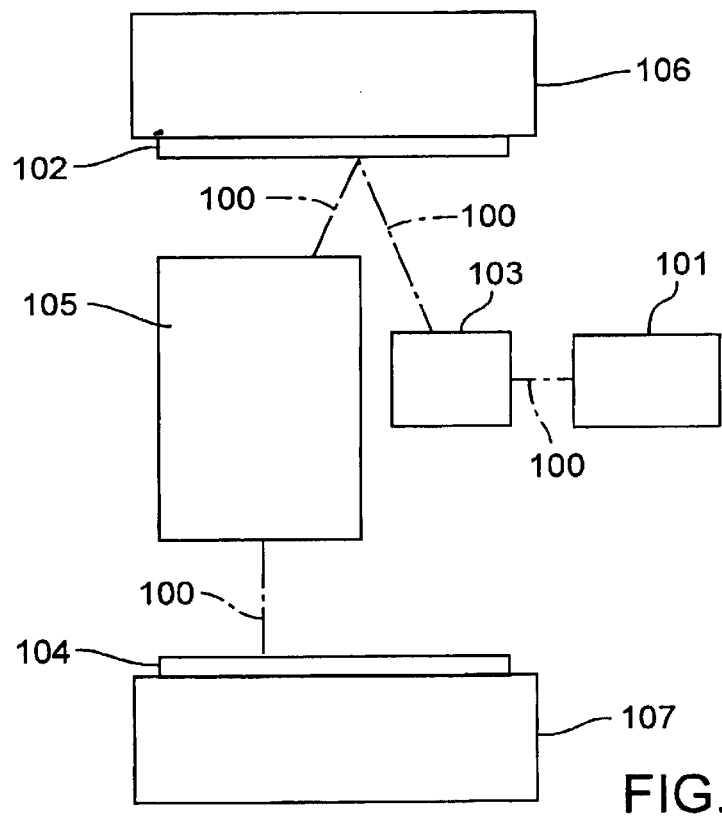
FIG. 13 is a block diagram of a conventional EUV lithography system that comprises an EUV optical column.
Figure 14:
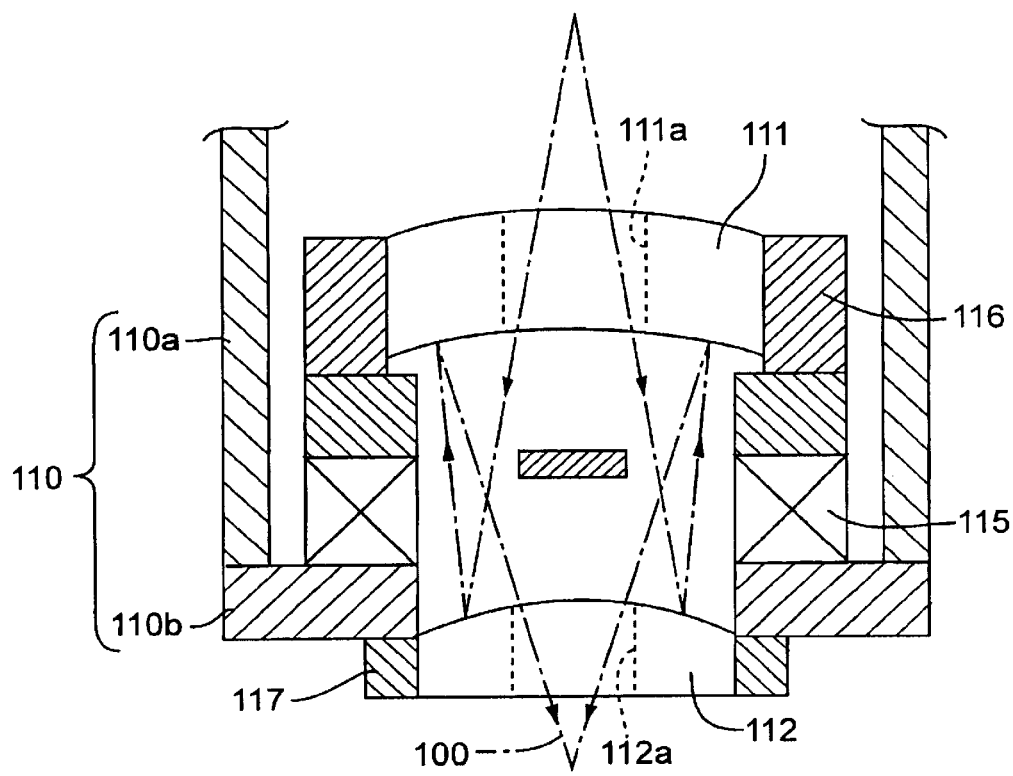
FIG. 14 is an elevational section of a two-element optical column of a conventional EUV lithography system.

After adjusting the position of the optical element 201 using the position-adjustment mechanisms 80, 81, 82 as described above, the position of the optical element desirably is maintained at the "adjusted" position. However, if the position-adjustment mechanisms 80, 81, 82 lack sufficient position-maintenance capability, the position-fixing mechanism 90 discussed above can be used (FIG. 3). FIGS. 12(A)–12(B) depict a representative embodiment of a position-fixing mechanism 90, which comprises a clamp member 91 and a flat-spring member 92 that connect the mounting member 3 to the annular member 2. The flat-spring member 92 prevents the mounting member 3 from experiencing a positional shift whenever the annular member 2 and mounting member 3 are joined to the clamp member 91 by a screw or analogous fastener. The flat-spring member 92 comprises two spring portions 95 serially connected to and flanking a rigid portion 96. The two spring portions 95 are co-planar. Multiple (at least three) flat-spring members 92 are arranged equi-angularly around the mounting member 3. The respective degrees of freedom of the flat-spring members 92 arranged in this manner have mutually different orientations.

Whenever the flat-spring members 92 are arranged in the manner described above, after adjusting the position of the holding device 20, respective movements and motion degrees of freedom of the flat-spring members 92 are mutually restrained, allowing the position of the optical element to be maintained. This restraint is especially effective whenever the position-fixing mechanisms 90 are arranged equi-angularly at 120° intervals, as shown in the figure, and the flat-spring members 92 also are arranged at 120° intervals. Note that three respective pairs of position-fixing mechanisms 90 and flat-spring members 92 provide optimal "balance." Hence, this arrangement is the ideal configuration. However, if higher stiffness is desired, four or more pairs can be employed. However, use of four or more pairs can result in a statically indeterminate and excessive restraint of the mounting member 3. In any event, if the mounting member 3 experiences warping, the spring-loaded support members 70 absorb the stress and exhibit corresponding strain. As a result, warping of the mounting member 3 is isolated from the optical element 201. This is desirable because the warp tolerance of the mounting member 3 is substantially larger than the deformation tolerance of the optical element 201.

If the optical element 201 is a mirror, it is possible to correct reflective-surface shape-errors of the mirror using an actuator as shown in FIGS. 11(A)–11(B). Correction of shape-error of a mirror is a separate adjustment from the fine adjustment of the mirror position as described above. For correcting shape errors, an embodiment of a two-dimensional actuator (shape-error-adjustment mechanism) is shown in FIGS. 11(A) and 11(B). The shape-error-adjustment mechanism is provided between the spring-loaded support member 70 and the mounting member 3.

More specifically, in FIGS. 11(A)–11(B), a two-dimensional actuator B is situated between the support member 70 and the mounting member 3 (FIG. 3). Energization of the two-dimensional actuator B applies a displacement in the circumferential or radial direction to the support member 70. FIG. 11(A) schematically shows a situation in which the support member 70 has been displaced in the radial direction by the actuator B, which applies a moment (arrow M1) to the mounting protrusion 201A of the optical element 201. FIG. 11(B) schematically depicts a situation in which the support member 70 has been displaced in the circumferential direction by the actuator B, resulting in application of a moment (arrow M2) to the mounting protrusion 201A. Whenever the optical element 201 exhibits deformation, wavefront aberration from the element changes. With the configuration shown in FIGS. 11(A)–11(B), moments can be applied that impart a wavefront aberration sufficient to correct the shape error of the optical element.

Whereas the invention has been described in connection with multiple representative embodiments, the invention is not limited to those embodiments. On the contrary, the invention is intended to encompass all modifications, alternatives, and equivalents as may be included within the spirit and scope of the invention, as defined by the appended claims.

What is claimed is:

1. An optical-element mounting for holding an optical element relative to an optical column of an optical system that includes the optical element, the optical element having an axis, a periphery, and multiple discrete mounting protrusions extending from respective locations on the periphery, the mounting comprising:

a respective holding device mounted to each mounting protrusion;

each holding device comprising a first respective spring-loaded support member supporting the optical element relative to the optical column, the first spring-loaded support member being configured to provide rigid support of the respective mounting protrusion in a gravity direction while providing flexible support of the respective mounting protrusion in directions tangential to the periphery at the respective location, in a radial direction of the optical element at the respective location, and in a tilt direction, relative to the axis, of the optical element at the respective location; and each holding device also comprising at least a second respective spring-loaded support member supporting the respective mounting protrusion relative to the optical column, each second spring-loaded support member being configured to provide rigid support of the respective mounting protrusion in directions tangential to the periphery at the respective location while providing flexible support of the respective mounting protrusion in the gravity direction and in the radial direction at the respective location.

2. The mounting of claim 1, wherein each holding device further comprises a third respective spring-loaded support member supporting the respective mounting protrusion relative to the optical column, each third spring-loaded support member being configured to provide, in conjunction with the second spring-loaded support member, rigid support of the optical element in directions tangential to the periphery at the respective location while providing flexible support of the respective mounting protrusion in the gravity direction and in the radial direction at the respective location.

3. The mounting of claim 1, wherein:

each of the first and second spring-loaded support members comprises a respective two pairs of flat springs; and each pair of flat springs comprises respective first and second flat springs serially arranged in a respective longitudinal direction in which the respective support member provides rigid support for the optical element, while being flexibly compliant in the directions in which the respective spring-loaded support member provides flexible support for the optical element.

4. The mounting of claim 1, wherein each of the respective first and second flat springs in each pair thereof comprises, in serial connection, a rigid portion flanked by the respective first and second flat springs.

5. The mounting of claim 1, wherein, with respect to each of the first and second spring-loaded support members:

each of the first and second flat springs in each pair of flat springs is configured as a respective two-dimensional flat spring; and the first and second flat springs in each pair are perpendicular to each other in respective orthogonal directions that are mutually perpendicular to each other and to the longitudinal direction.

6. The mounting of claim 5, wherein each of the respective first and second flat springs in each pair thereof comprises, in serial connection, a rigid portion flanked by the respective first and second flat springs.

7. The mounting of claim 1, wherein:

each protrusion has a center; and with respect to each of the second spring-loaded support members, the constituent two pairs of flat springs have a center that is aligned with the center of the respective protrusion.

8. The mounting of claim 1, comprising at least three holding devices arranged equi-angularly around the periphery of the optical element.

9. An optical system, comprising:

an optical column comprising a mounting member;

an optical element having an axis, a periphery, and multiple discrete mounting protrusions extending from respective locations on the periphery; and an optical-element mounting serving to mount the optical element to the mounting member, the mounting comprising (i) a respective holding device mounted to each mounting protrusion; (ii) each holding device comprising a respective first spring-loaded support member supporting the optical element relative to the mounting member, the first spring-loaded support member being configured to provide rigid support of the respective mounting protrusion in a gravity direction while providing flexible support of the optical element in directions tangential to the periphery at the respective locations, in a radial direction of the optical element at the respective location, and in a tilt direction, relative to the axis, of the optical element at the respective location; and (iii) each holding device also comprising at least a respective second spring-loaded support member supporting the optical element relative to the mounting member, each second spring-loaded support member being configured to provide rigid support of the optical element in directions tangential to the periphery at the respective location while providing flexible support of the optical element in the gravity direction and in the radial direction at the respective location.

10. The optical system of claim 9, further comprising at least one shape-adjustment mechanism situated relative to a respective holding device and to the mounting member, the shape-adjustment mechanism comprising an actuator configured, when energized, to move the respective holding device relative to the mounting member and thus apply a moment to a respective portion of the optical element supported by the respective holding device so as to impose or change a shape error of the optical element.

11. The optical system of claim 10, wherein the shape-adjustment mechanism is configured to apply a displacement, in a direction perpendicular to the gravity direction, to at least one of the first spring-loaded support members.

12. The optical system of claim 11, wherein each of the spring-loaded support members comprises at least two respective flat springs oriented perpendicularly to each other.

13. The optical system of claim 9, further comprising at least one position-adjustment mechanism situated relative to the mounting member and the optical column, the position-adjustment mechanism comprising (i) an actuator configured, when energized, to move and thus apply a displacement force to a respective location on the mounting member relative to the optical column, and thus to a respective location on the optical-element mounting; and (ii) a drive-limiter mechanism serving to reduce a movement distance imparted to the respective location on the mounting member relative to a corresponding movement distance of the actuator.

* * * * *

UNITED STATES PATENT AND TRADEMARK OFFICE
CERTIFICATE OF CORRECTION

PATENT NO. : 6,859,337 B2 Page 1 of 1
DATED : February 22, 2005
INVENTOR(S) : Oshino et al.

It is certified that error appears in the above-identified patent and that said Letters Patent is hereby corrected as shown below:

Column 2,
Line 2, "not to be exhibit" should be -- not to exhibit --.

Column 3,
Line 10, "devices arranged" should be -- devices are arranged --.

Column 16,
Line 18, "can be moved turned" should be -- can be turned --.
Line 66, "allows" should be -- allow --.

Column 17,
Line 62, "segment 75b." should be -- segment 75b). --.

Column 18,
Line 12, "segment 76b." should be -- segment 76b). --.

Column 22,
Lines 30 and 34, "of claim 1," should be -- of claim 3, --.

Signed and Sealed this

Fourth Day of April, 2006

JON W. DUDAS
*Director of the United States Patent and Trademark Office*